US008653472B2

(12) United States Patent
Harada et al.

(10) Patent No.: US 8,653,472 B2
(45) Date of Patent: Feb. 18, 2014

(54) ELECTROMAGNETIC FIELD APPLICATION SYSTEM

(75) Inventors: Ken Harada, Fuchu (JP); Akira Sugawara, Yokohama (JP); Noboru Moriya, Tokorozawa (JP)

(73) Assignee: Hitachi, Ltd., Tokyo (JP)

(*) Notice: Subject to any disclaimer, the term of this patent is extended or adjusted under 35 U.S.C. 154(b) by 60 days.

(21) Appl. No.: 12/854,262

(22) Filed: Aug. 11, 2010

(65) Prior Publication Data
US 2011/0073759 A1 Mar. 31, 2011

(30) Foreign Application Priority Data

Sep. 30, 2009 (JP) ................................ 2009-225864

(51) Int. Cl.
*G21K 5/04* (2006.01)
(52) U.S. Cl.
USPC ............... 250/396 ML; 250/396 R; 250/306; 250/307; 250/492.1
(58) Field of Classification Search
USPC ...... 250/396 R, 397, 398, 396 ML, 306, 307, 250/309, 310, 311, 492.1, 492.3
See application file for complete search history.

(56) References Cited

U.S. PATENT DOCUMENTS

| 6,838,675 B2 | 1/2005 | Harada et al. |
| 2004/0061066 A1* | 4/2004 | Harada et al. .......... 250/396 ML |
| 2004/0188630 A1* | 9/2004 | Brunner et al. ............ 250/396 R |
| 2008/0173814 A1* | 7/2008 | Watanabe et al. ............. 250/310 |

FOREIGN PATENT DOCUMENTS

| JP | S47-21719 | 11/1973 |
| JP | 2002-296333 | 10/2002 |
| JP | 3469213 | 9/2003 |

* cited by examiner

*Primary Examiner* — Nicole Ippolito
(74) *Attorney, Agent, or Firm* — Antonelli, Terry, Stout & Kraus, LLP.

(57) ABSTRACT

The present invention is based on the property that the electric and magnetic fields are independent of each other and normal to each other and the property that the deflection of a charged particle beam by the electromagnetic field follows the rule of linear combination. The present invention employs a system that creates a region in which there exist both electromagnetic field and controls the deflection of a charged particle beam in each of the electric and magnetic fields.

16 Claims, 28 Drawing Sheets

FIG. 4

[NUMBER 1] $\quad F_B = qvB = \sqrt{\dfrac{2q^3}{m}}\sqrt{V_0}B$

[NUMBER 2] $\quad \theta_B = \dfrac{qBl_B}{mv} = \sqrt{\dfrac{q}{2m}}\dfrac{Bl_B}{\sqrt{V_0}}$

[NUMBER 3] $\quad F_E = qE = \dfrac{qV_1}{d}$

[NUMBER 4] $\quad \theta_E = \dfrac{qEl_E}{2mv^2} = \dfrac{l_E}{4d}\dfrac{V_1}{V_0}$

[NUMBER 5] $\quad E = 2vB$

[NUMBER 6] $\quad \theta_1 = -\dfrac{1}{2}\theta_2$

[NUMBER 7] $\quad \theta_2 = -\theta_S$

[NUMBER 8] $\quad \theta_1 = \dfrac{qB}{mv}\dfrac{l_B - l_E}{4}$

[NUMBER 9] $\quad \theta_2 = \dfrac{1}{4d}\dfrac{V_1}{V_0} + \dfrac{qB}{mv}\dfrac{l_E}{2}$

[NUMBER 10] $\quad \theta_S = \dfrac{qB}{mv}\dfrac{l_B - l_E}{2}$

[NUMBER 11] $\quad \dfrac{l_E}{8d}\dfrac{V_1}{V_0} = \dfrac{qB}{mv}l_B$

[NUMBER 12] $\quad E = \dfrac{l_B}{l_E}\cdot 4vB$

ELECTROMAGNETIC FIELD APPLICATION SYSTEM

CLAIM OF PRIORITY

The present application claims priority from Japanese patent application JP 2009-225864 filed on Sep. 30, 2009, the content of which is hereby incorporated by reference into this application.

FIELD OF THE INVENTION

The present invention relates to an electromagnetic field application system which is suitable for use to apply electric and/or magnetic fields to a specimen or workpiece for observation or fabrication by means of an electron microscope or a charged particle beam apparatus.

BACKGROUND OF THE INVENTION

The charged particle beam apparatus including electron microscopes employs externally applied electric and/or magnetic fields as the electromagnetic lens or deflectors which effectively and directly act on the charged particle beam (which is used as the probe) through Lorentz force or electrostatic force.

Especially in the field of electron microscopes, it is common practice to achieve a high resolution by placing a specimen in a strong magnetic field of an electromagnetic lens and employing an imaging optical system with a short focal length and limited astigmatism.

On the other hand, a specimen of magnetic material needs a device that protects it from adverse effects of magnetic fields because it is susceptible to magnetic fields externally applied by electromagnetic lenses. This object is achieved by turning off the electromagnetic lens, placing the specimen far away from the magnetic field of the electromagnetic lens, or using a magnetic shield lens that precludes the specimen from the magnetic field.

Conversely, there in an instance in which it is necessary to control the intensity and direction of the magnetic field applied to the specimen instead of avoiding the effect of the external magnetic field on the specimen. This is true for observation of superconducting magnetic flux quantum or investigation of magnetic properties of spintronics elements, in which case the mutual action of the specimen and the external magnetic field is an important parameter in experiments. Observation of a specimen in the presence of magnetic field applied thereto needs a special magnetic field application system, with the optical system for the charged particle beam taken into careful consideration, because the application of external magnetic field to the specimen, especially that in the direction perpendicular to the optical axis, causes the charged particle beam to easily deviate from the optical axis.

Japanese Patent No. 3469213, for example, discloses an magnetic field application system which is constructed such that the charged particle beam passing through the specimen describes its trajectory by deflecting systems arranged in five stages, with two each upstream and downstream the flow of the charged particle beam, symmetric with respect to the intersection of the specimen and the charged particle beam. The structure with five deflecting systems permits the specimen to receive the maximum magnetic field generated by the apparatus and also permits the charged particle beam to transmit the specimen along the optical axis in the direction parallel to the optical axis.

SUMMARY OF THE INVENTION

The foregoing apparatus designed to apply a magnetic field to a specimen for deflection of a charged particle beam in five stages has the disadvantage of being complex in structure and large in size because it needs two deflecting systems each arranged above and below symmetrically with respect to specimen.

Moreover, the foregoing apparatus is large in size on account of its mechanical complexity as well as the fact that magnetic fields occupy a certain physical space. To be specific, the region of the applied magnetic field expands around the optical axis in proportion to the size of the magnetic pole or magnetic oil (which is mechanically feasible) and the distance from the source of magnetic field to the specimen. The deflecting systems to deflect the charged particle beam in the opposite direction are arranged above and below and outside the physically expanding region of magnetic field, and each of the deflecting systems also has a physically expanding region of magnetic field. If the deflecting systems are to be so constructed as to avoid the overlapping of the expanding regions of magnetic field, it is necessary to provide a sufficient distance between the individual deflecting systems, and this leads to the large-sized magnetic field application system.

This means that the magnetic field application system also needs a large space for itself and the charged particle beam apparatus as a whole has to be large in size. This in turn complicates the design of the apparatus.

It is an object of the present invention, which was completed to address the foregoing problem, to provide an apparatus for application of a magnetic field to be used in the charged particle beam equipment, with a specimen placed on the optical axis of the charged particle beam, the apparatus being so constructed as to apply simultaneously a magnetic field and an electric field, the magnetic field being applied in a specific direction in a specific region containing a plane perpendicular to the optical axis and the plane holding the specimen thereon, and the electric field being applied in the region in which the magnetic field is applied.

It is another object of the present invention to provide an apparatus for application of an electric field to be used in the charged particle beam equipment, with a specimen placed on the optical axis of the charged particle beam, the apparatus being so constructed as to apply simultaneously an electric field and a magnetic field, the electric field being applied in a specific region containing a plane perpendicular to the optical axis and the plane holding the specimen thereon and in a direction parallel to the plane holding the specimen thereon, and the magnetic field being applied in at least one part in the region in which the electric field is applied and in a direction parallel to the plane holding the specimen thereon and perpendicular to the direction in which the electric field is applied.

The present invention is characterized by the introduction of an electric field for deflection in the opposite direction in the region in which a magnetic field is applied to a specimen. In this way it achieves deflection equivalent to deflection in the opposite direction in multiple stages within a smaller space than in the conventional technology, thereby reducing the size of the mechanism for application of a magnetic field.

Moreover, the new function for introduction of an electric field allows the application of an electric field as well as magnetic field to a specimen. That is, the present invention provides an electromagnetic field application system which is capable of applying both electric and magnetic fields to a specimen despite its small size.

BRIEF DESCRIPTION OF THE DRAWINGS

FIG. 4 is a diagram showing those formulas used in the description of the specification;

DETAILED DESCRIPTION OF THE PREFERRED EMBODIMENTS

The present invention is based on the property that the electromagnetic field are independent from each other and normal to each other and the property that the deflection of a charged particle beam by the electromagnetic field follows the rule of linear combination.

To be specific, the present invention employs a system for deflection in the opposite direction which introduces a region of electric field (or magnetic field) into a region of magnetic field (or electric field) applied to a specimen, so that the system creates a region in which there exist both electric and magnetic fields and controls the deflection of a charged particle beam in each of the electric and magnetic fields.

The foregoing system for deflection functions as follows. In the case where a magnetic field is applied to a specimen and an electric field is applied for deflection of a charged particle beam in the opposite direction, the deflection in the opposite direction by the electric field predominates over the deflection by the magnetic field. Likewise, in the case where an electric field is applied to a specimen and a magnetic field is applied for deflection of a charged particle beam in the opposite direction, the deflection in the opposite direction by the magnetic field predominates over the deflection by the electric field.

Figure 1:
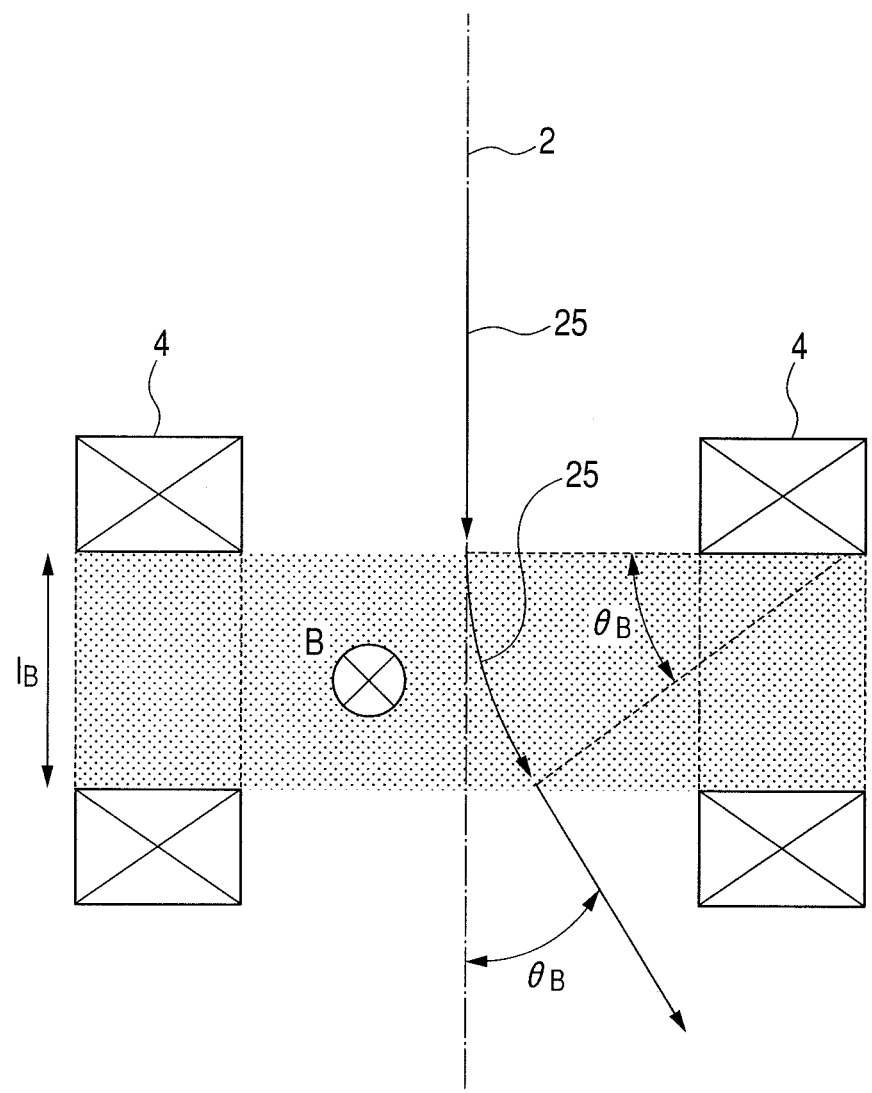
FIG. 1 is a schematic diagram illustrating the deflection of a charged particle beam by a homogenous magnetic field.
Figure 2:
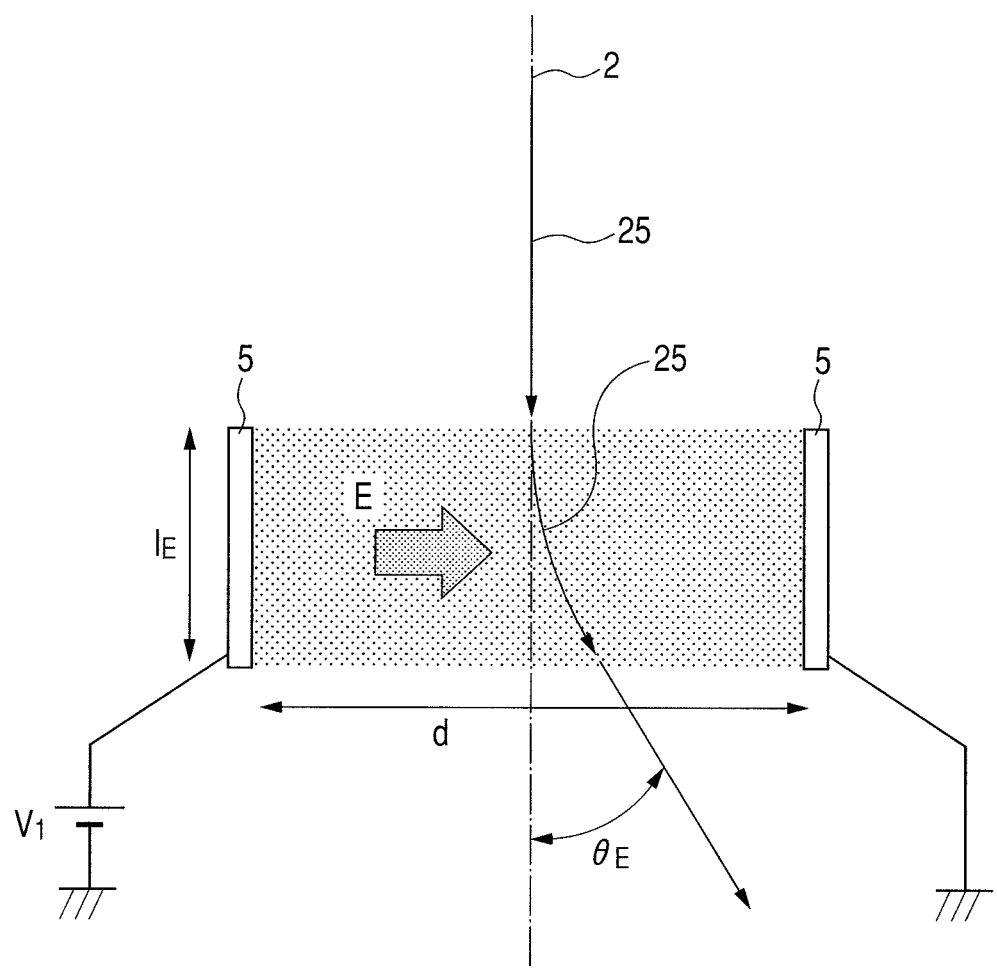
FIG. 2 is a schematic diagram illustrating the deflection of a charged particle beam by a homogenous magnetic field.

A detailed description of the present invention will be given below with reference to the accompanying drawings. FIGS. 1 and 2 illustrate how the movement of a charged particle is deflected.

It is known that a charged particle moves in a homogeneous magnetic field to describe a circular trajectory around an axis parallel to the direction of the magnetic field, as shown in FIG. 1. It is also known that a charged particle moves in a homogenous electric field to describe a parabolic trajectory which curves in the direction of the electric field, as shown in FIG. 2.

The circular motion of a charged particle in a magnetic field is caused by Lorentz force $F_B$, which is represented by the formula 1 in FIG. 4. The deflection angle $\theta_B$ (which is an angle at which a charged particle emerges from a homogenous magnetic field after deflection) is represented by the formula 2 in FIG. 4, which is an approximation derived from an assumption that the magnetic field has a homogeneous and fixed intensity throughout and the disturbed distribution of magnetic field at the edges shown in FIG. 1 is ignored. In the formula 2, q denotes the charge of a charged particle, m denotes the mass of a charged particle, v denotes the velocity of a charged particle, B denotes the magnetic field applied, $V_0$ denotes the accelerating voltage for a charged particle beam, and $l_B$ denotes the width of the region of the magnetic field. On the other hand, a charged particle in an electric field receives an electrostatic force from the electric field and it undergoes accelerated movement in the direction of the electric field. The electrostatic force $F_E$ is represented by the formula 3 in FIG. 4. As in the case of magnetic field, the deflection angle $\theta_E$ (which is an angle at which a charged particle emerges from a homogenous electric field after deflection) is represented by the formula 4 in FIG. 4, which is an approximation derived from an assumption that the electric field has a homogeneous intensity throughout and the disturbed distribution of electric field at the edges shown in FIG. 2 is ignored. In the formulas 3 and 4, E denotes the electric field applied, $V_1$ denotes the voltage applied to the electrostatic deflection system, d denotes the distance between the parallel-plate electrodes, and $l_E$ denotes the width of the region of the electric field.

If the Lorentz force $F_B$ balances with the electrostatic force $F_E$, the external forces acting on the charged particle cancel each other, allowing the charged particle to describe a straight trajectory. (See the formulas 1 and 3.) The condition for this is expressed by the formula 5 in FIG. 4.

The foregoing is known as Wien condition, which tells that the Lorentz force $F_B$ is proportional to the velocity v of a charged particle and hence the electric field E needs to be large to balance with the magnetic field B according as the accelerating voltage $V_0$ for a charged particle increases and hence the velocity v increases.

The deflection of a charged particle beam by the magnetic field B and the electric field E, which function independently and follow the rule of linear combination, has come into practical use in various apparatus since the first half of the twentieth century in which technologies to control charged particle beams became available. An exemplary embodiment of such apparatus is the mass spectrometer, which is classified into the Thomson variation so designed as to apply the magnetic field B and the electric field E in directions parallel to each other (B//E), the Aston variation so designed as to apply the magnetic field B and the electric field E in directions normal to each other (B⊥E), and the Bainbridge variation. Exemplary embodiments of electron beam apparatus include the Wien filter which functions as a monochromator for charged particle beams, the spin detector, and the photoelectron spectrometer. All of these apparatus are designed such that the electric and magnetic fields are applied before the charged particle beam impinges upon a specimen or after the charged particle beam has passed through or has been reflected by a specimen. In other words, they are not designed such that the electric and magnetic fields are applied while a charged particle beam is passing through a specimen.

First Embodiment

Figure 5:
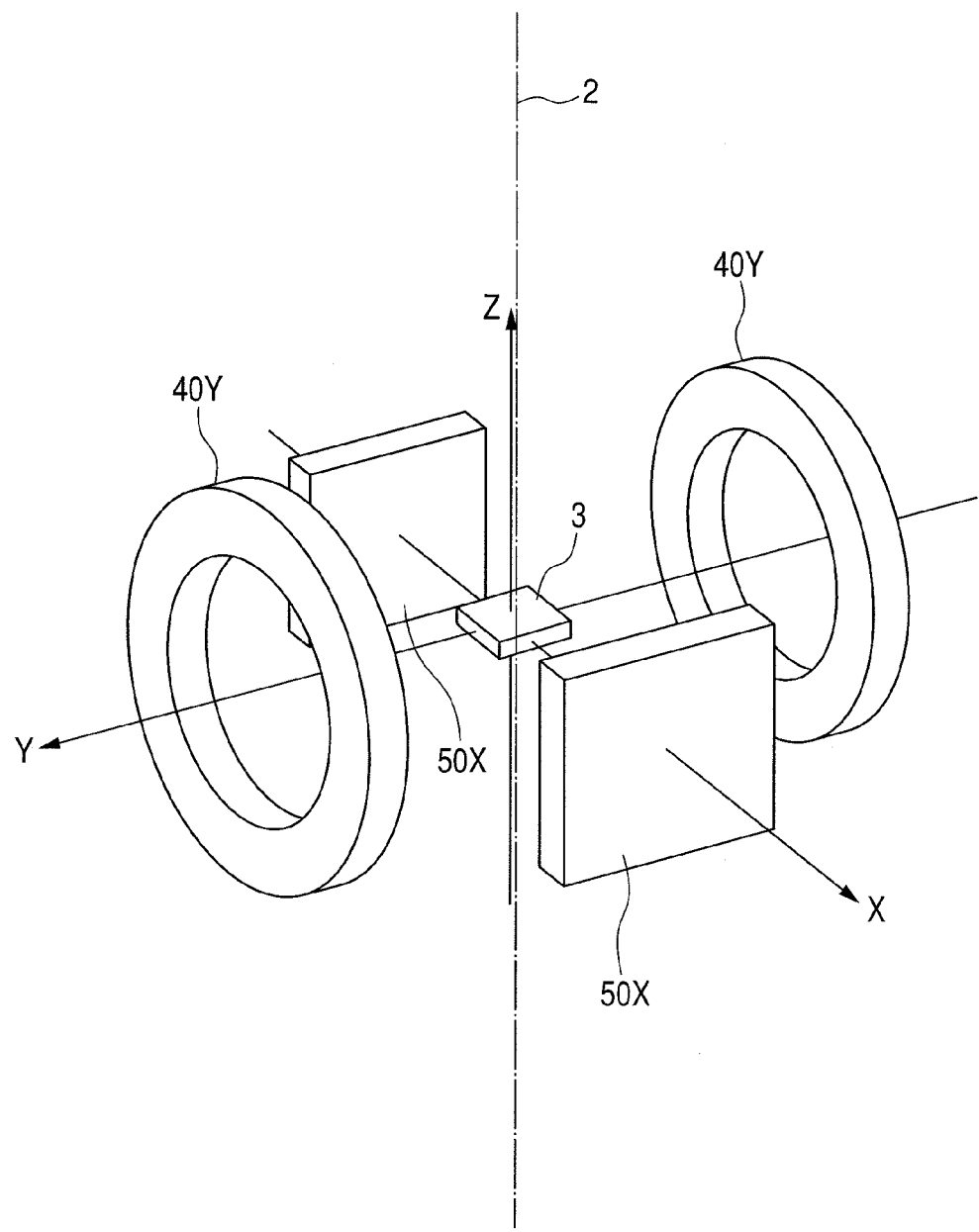
FIG. 5 is a schematic diagram illustrating the structure according to the first embodiment.

FIG. 5 is a schematic diagram illustrating the simplest structure according to an exemplary embodiment of the present invention. This structure is designed such that the magnetic field and the electric field, which are normal to each other, are applied in a plane perpendicular to the optical axis. Since the Lorentz force due to the magnetic field deflects the charged particle beam in the direction perpendicular to the direction of the magnetic field, it is possible to arrange the coil-pair and the parallel-plate electrode-pair at any position where they do not spatially interfere with each other.

The structure shown in FIG. 5 is capable of applying the electric and magnetic fields simultaneously to a specimen. In FIG. 5, the specimen 3 is placed at the origin of the orthogonal coordinate system, the optical axis 2 coincides with the Z axis, the electric field produced by the parallel-plate electrode-pair 50X orients in the direction of the X axis, and the magnetic field produced by the coil-pair (or a pair of coils 40Y) orients in the direction of the Y axis. Although the coils 40Y in FIG. 5 merely represent their coil bobbins for simple drawing, they may have a magnetic core to enhance the magnetic field to be applied to the specimen 3. Needless to say, the magnetic core may be a soft magnetic material, such as permalloy, which is limited in residual magnetism. When the foregoing structure applies the electric and magnetic field that satisfy the condition of the formula 5, the charged particle beam transmits the specimen without deflection at all. This situation obviates in principle the necessity of making adjustment to the optical system of the charged particle beam.

Figure 6:
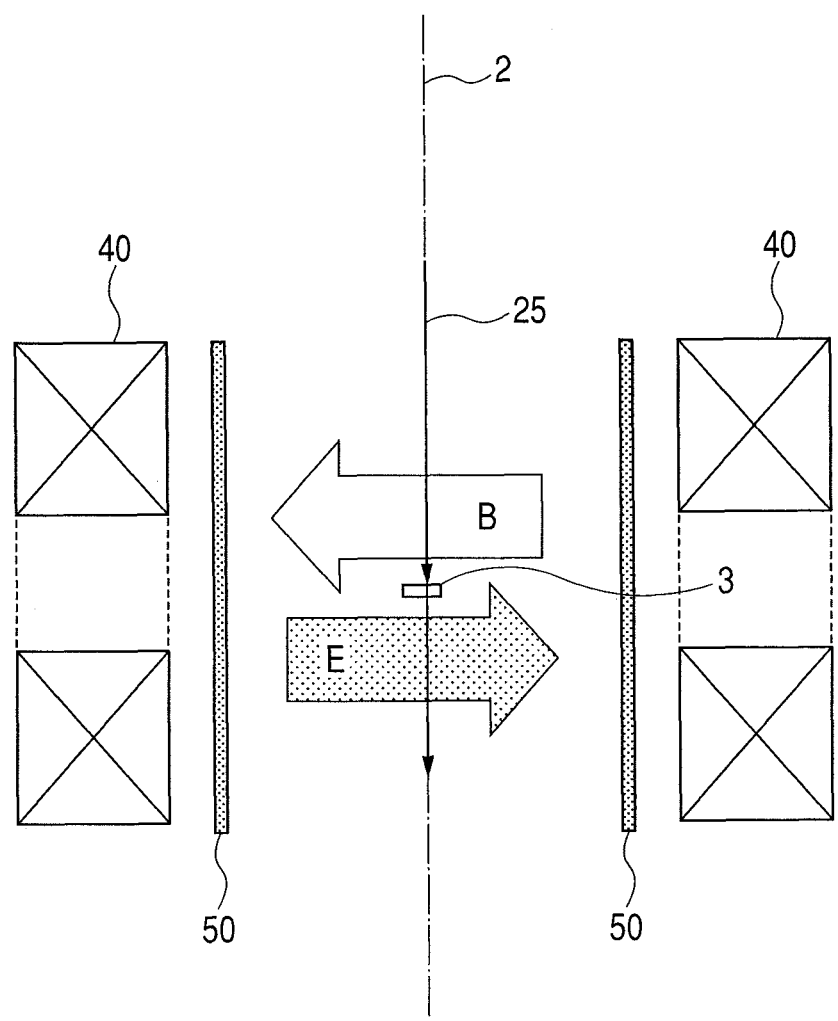
FIG. 6 is a schematic diagram illustrating the relationship between the electromagnetic field and the trajectory of a charged particle beam in the first embodiment.

FIG. 6 was schematically drawn to clarify how the charged particle beam 2 has its trajectory 25 deflected by electromagnetic field applied to the specimen 3 in the structure depicted in FIG. 5. FIG. 6 differs from FIG. 5 in that the coil-pair 40 and the parallel-plate electrode-pair 50 are arranged on the same axis. This arrangement, however, is merely for the sake of convenience. In actual, they are arranged perpendicular to each other as shown in FIG. 5. The electromagnetic field is applied to the specimen 3 simultaneously so that their effects cancel out each other, with the result that the charged particle beam 25 proceeds along the optical axis 2 without deflection. The simplified representation as in FIG. 6 will be repeated hereunder when necessary to direct attention to the electric and magnetic fields applied to the specimen and the trajectory of the charged particle beam.

Figure 7:
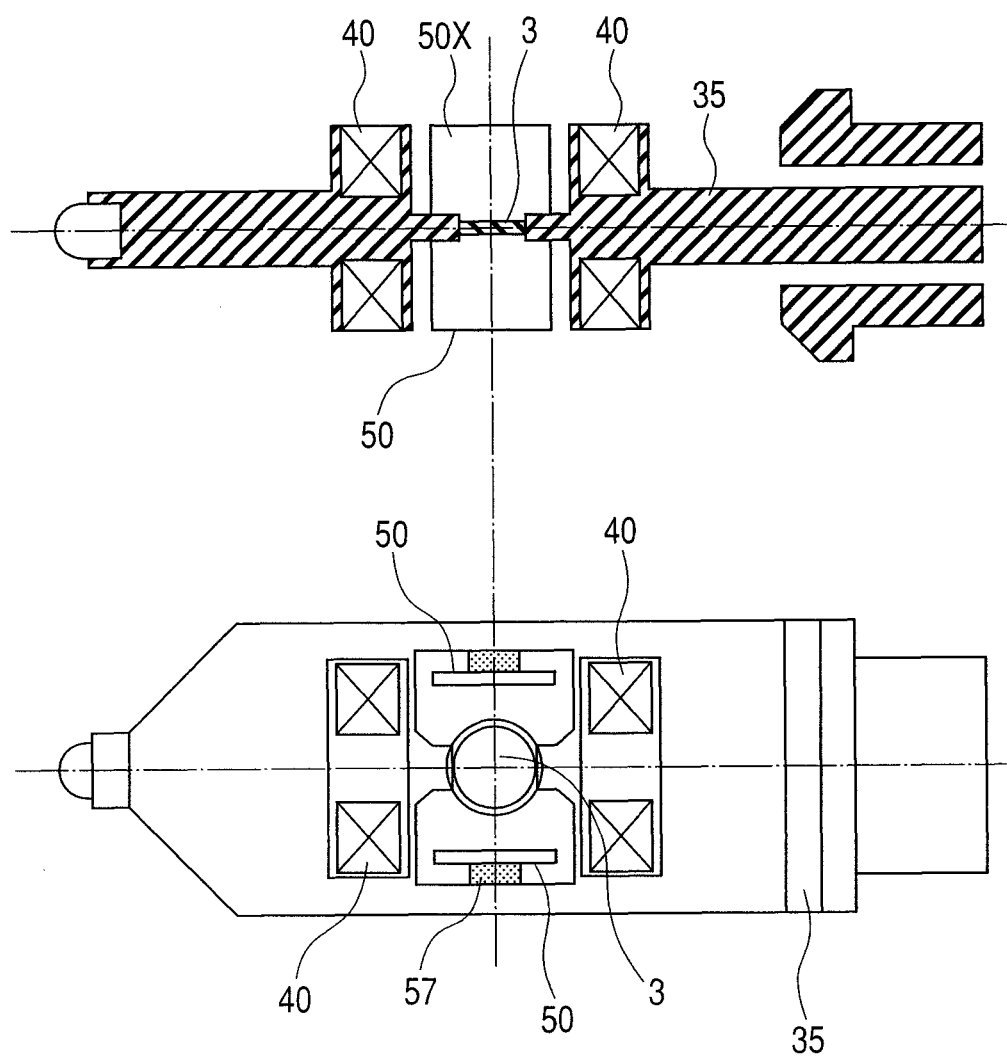
FIG. 7 is a schematic diagram illustrating the structure according to the first embodiment, with a specimen holder incorporated thereinto.

FIG. 7 is a schematic diagram illustrating the electromagnetic field application system, with the specimen holder 35 incorporated thereinto, according to this exemplary embodiment. This apparatus is constructed such that the axis of the specimen holder 35 coincides with the magnetic axis of the coil-pair 40 and the parallel-plate electrode-pair 50 are arranged at both sides of the specimen holder 35. If combined with the specimen holder 35, the electromagnetic field application system needs, in general, the readjustment of the optical system each time the position for observation of the specimen changes. However, this is not true in the case where the electric and magnetic fields applied satisfy the condition defined by the formula 5 and hence the charged particle beam is not deflected.

Figure 3:
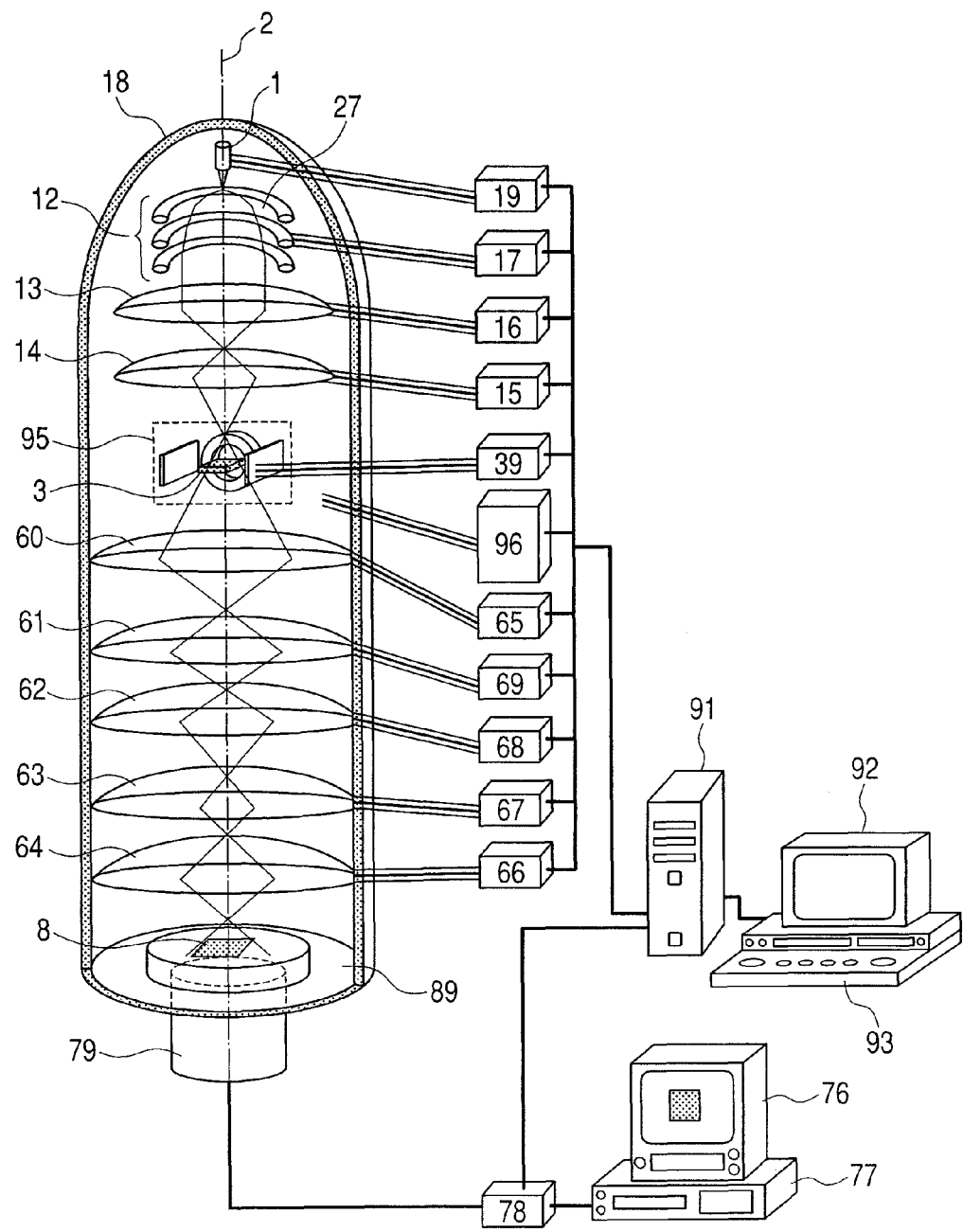
FIG. 3 is a schematic diagram illustrating an electron microscope incorporated with the electromagnetic field application system according to a first embodiment.

FIG. 3 is a schematic diagram illustrating an electron microscope incorporated with the electromagnetic field application system 95 which is the same one as shown in FIG. 5. It is assumed that the electron microscope has the accelerating voltage of about 100 to 300 kV. Incidentally, in FIG. 3, the electromagnetic field application system 95 is depicted, with one member of the coil-pair 40 omitted for brevity.

The electromagnetic field application system 95 is placed above the objective lens 60 at which the magnetic field of the objective lens 60 produces no effect.

The electron microscope shown in FIG. 3 has the lenses (13 and 14) for the condenser optical system and the lenses (61, 62, 63, and 64) for the enlarging imaging system as its constituents. However, it may have additional ones. There are shown in FIG. 3 the control unit 19 for the electron gun, the control unit 17 for the acceleration tube, the control unit 16 for the first irradiating lens, the control unit 15 for the second irradiating lens, the control unit 96 for the electromagnetic field application system 95, the control unit 39 for fine adjustment of the specimen, the control unit 65 for the objective lens, the control unit 69 for the first imaging lens, the control unit 68 for the second imaging lens, the control unit 67 for the third imaging lens, the control unit 66 for the fourth imaging lens, the observing and recording plane 89 on which the image 8 of the specimen is formed, the recording medium 79 for the image, the control unit 78 for the image observing and recording medium, the image recording apparatus 77, the image displaying apparatus 76, the computer 91 to control the entire system of the electron microscope, the monitor 92 of the control computer 92, and the interface 93 for the control computer. The foregoing is a mere example, and it may be modified and changed according to need.

The electron microscope in actual use has, in addition to the foregoing constituents shown in FIG. 3, the deflecting system to control the advancing direction of the electron beam 27 and the aperture to restrict the region for the electron beam to transmit. These devices, however, are omitted in FIG. 3 because they have nothing to do with the present invention. Moreover, the electron optical system is assembled in the vacuum container 18 which is continuously evacuated by a vacuum pump. The vacuum system is omitted here because it has nothing to do with the present invention.

The electron microscope constructed as mentioned above works in the following way. The electron gun 1 emits the electron beam 27, which impinges on a desired part of the specimen 3. The electromagnetic field application system 95 (which is shown FIG. 5) applies electric and magnetic fields simultaneously to a specific region containing the specimen in response to instructions from the control computer 91 after the lens and deflection systems have been properly adjusted so that a magnified image of the specimen can be observed. The electron beam 27 is properly deflected in the region where the thus produced electric and magnetic fields exist together. Consequently, the electron beam 27 propagates without deviating from the optical axis 2 and forms the image 8 of the specimen on the observing and recording plane 89.

The structure according to the first embodiment is so constructed as to form the region where the electric and magnetic fields coexist and deflect the charged particle beam there. To be specific, it controls electric and magnetic fields in such a way that deflection by the electric field and deflection by the magnetic field cancel out each other. This will be discussed later in more detail.

According to this exemplary embodiment, the charged particle beam is controlled in a specific region containing the specimen where electric and magnetic fields coexist. This offers the advantage of eliminating the conventional complicated apparatus of multistage structure for deflection in the opposite direction or achieving the same object as before with a small-sized apparatus. Size reduction is desirable for vibration resistance and stable image observation.

The apparatus mentioned above is capable of applying electric and magnetic fields simultaneously to the specimen. Therefore, it is useful for minute observation and fabrication of a magnetic dielectric material (promising for high-function elements such as high-frequency filter and high-frequency antenna elements) which changes in properties in the coexistence of electric and magnetic fields.

Second Embodiment

Figure 8:
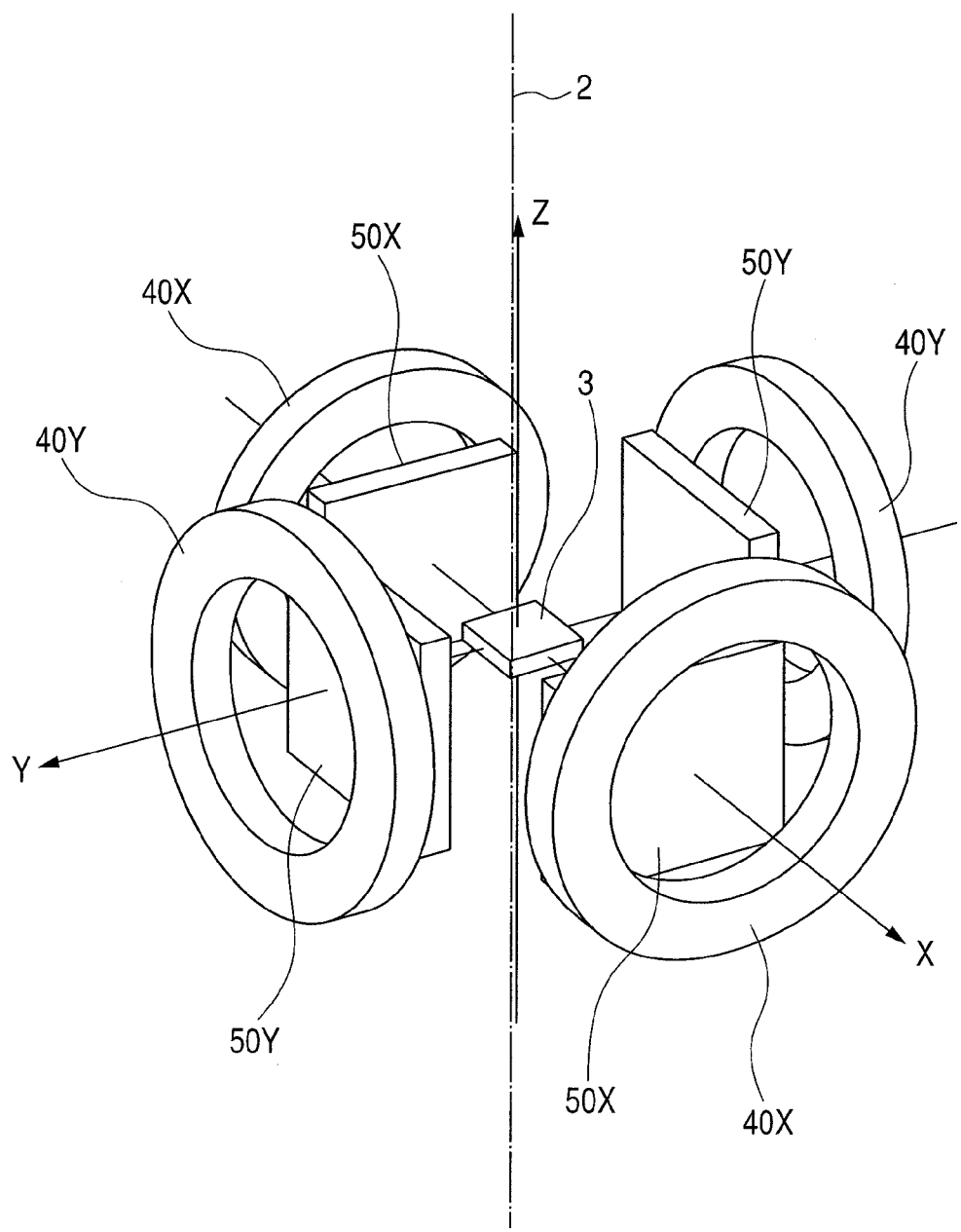
FIG. 8 is a schematic diagram illustrating the structure according to a second embodiment.

The structure according to the second embodiment of the present invention is schematically shown in FIG. 8. It is similar to that according to the first embodiment but is different in having two sets of the coil-pairs (40X and 40Y) and two sets of the parallel-plate electrode-pair (50X and 50Y), with both the electric field and the magnetic field orienting in the directions of the X axis and Y axis, respectively. This arrangement permits the electric and magnetic fields to be applied in any direction in the X-Y plane at which the specimen 3 is placed. According to this embodiment, the parallel-plate electrode-pair (50X and 50Y) are arranged inside the coil-pairs (40X and 40Y) so as to produce a strong electric field effectively, thereby enhancing the effect of deflection by the electric field, in view of the fact that the electric field is less powerful than the magnetic field in deflecting a high-velocity charged particle beam (as suggested by the formula 5) and the low deflecting power is compensated for by applying the voltage at a position close to the trajectory of charged particle beam. If the coils and electrodes are arranged such that the direction of the combined magnetic fields in the X and Y axes is perpendicular to the direction of the combined electric fields in the X and Y axes, in which case the condition of formula 5 is satisfied, the charged particle beam does not undergo deflection at all and transmits the specimen in the direction parallel to the optical axis 2.

As mentioned above, the structure according to this embodiment permits the electric and magnetic fields to be adjusted in the directions of the X and Y axes. In other words, it is capable of applying the desired electromagnetic field in any direction in the X-Y plane perpendicular to the optical axis at which the specimen is placed. Therefore, it is useful for minute observation and fabrication of a magnetic dielectric material (promising for high-function elements such as high-frequency filter and high-frequency antenna) which changes in properties in the coexistence of electric and magnetic fields.

Third Embodiment

Figure 9:
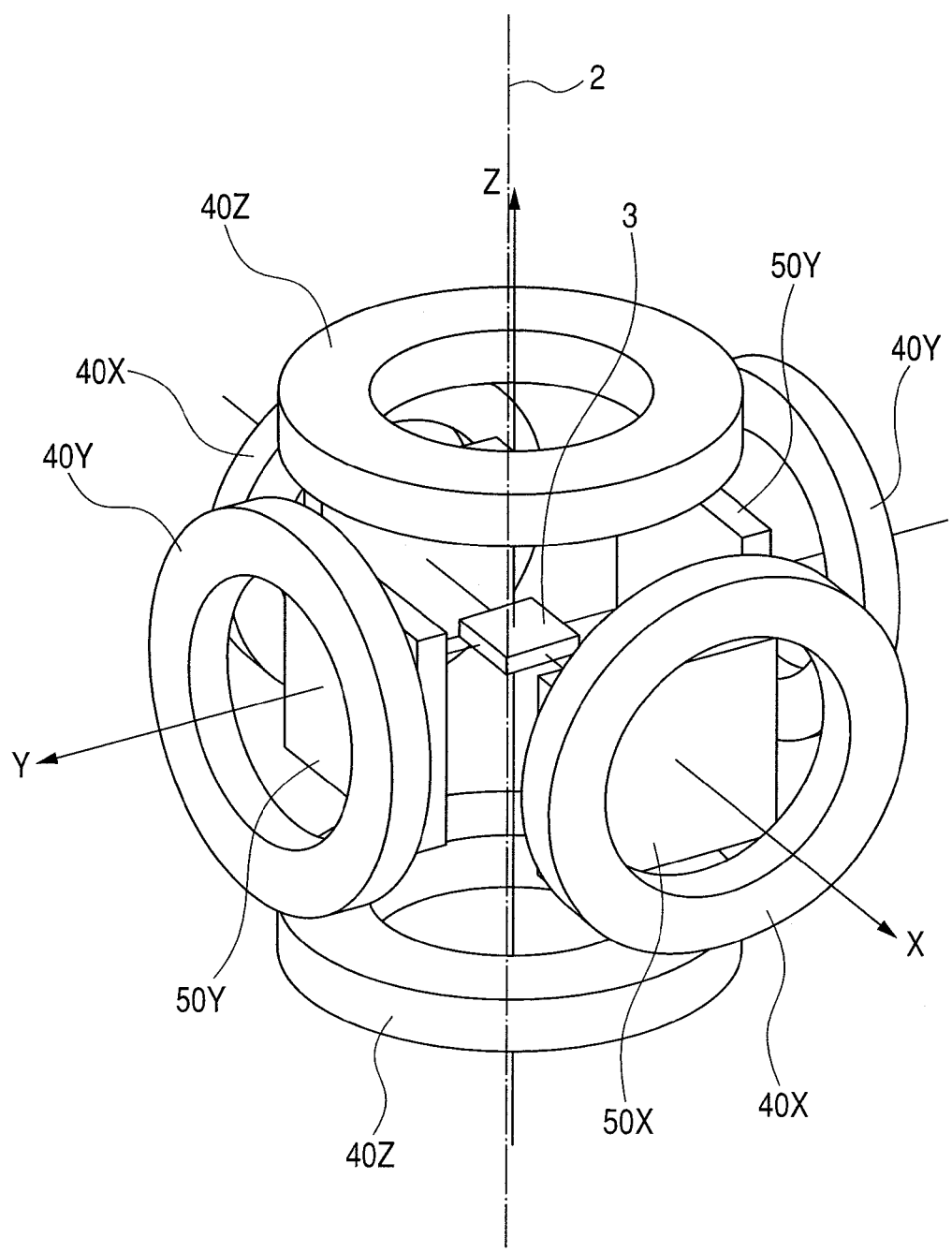
FIG. 9 is a schematic diagram illustrating the structure according to a third embodiment.

The structure according to a third embodiment of the present invention is schematically shown in FIG. 9. It is similar to that according to the second embodiment but is different in having one additional set of the coil-pair 40Z. This structure permits the magnetic field to be applied to the specimen 3 in the direction of the Z axis. It needs no device for compensation because the magnetic field parallel to the optical axis 2 does not greatly deflect the charged particle beam like the electromagnetic lens. The coil-pair 40Z to apply the magnetic field in the direction of the Z axis needs an opening for the charged particle beam to transmit along the optical axis 2 unless the coil is coreless.

As mentioned above, the structure according to this embodiment is capable of applying the magnetic field in the direction of the Z axis in addition to the electric and magnetic fields in the directions of the X axis and the Y axis. Therefore, it is useful for minute observation and fabrication of a magnetic dielectric material (promising for high-function elements such as high-frequency filter and high-frequency antenna) which changes in properties in the coexistence of electric and magnetic fields.

Fourth Embodiment

Figure 10:
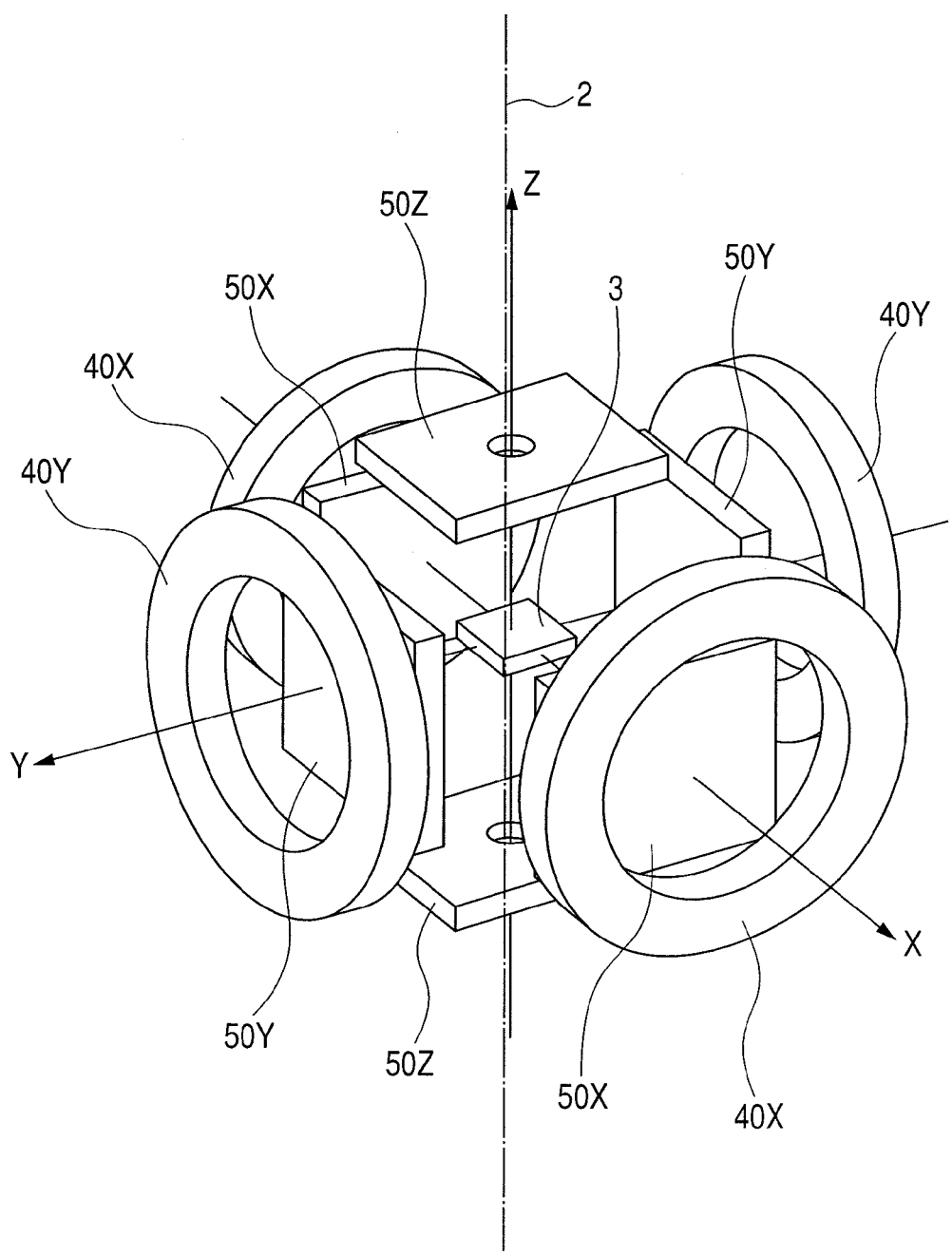
FIG. 10 is a schematic diagram illustrating the structure according to a fourth embodiment.

The structure according to a fourth embodiment of the present invention is schematically shown in FIG. 10. It differs from that according to the second embodiment shown in FIG. 8 in having one additional set of the parallel-plate electrode-pair 50Z to apply the electric field in the direction of the Z axis parallel to the optical axis 2. It needs no device for compensation because the electric field parallel to the optical axis 2 does not greatly deflect the charged particle beam. The parallel-plate electrode-pair 50Z to apply the electric field in the direction of the Z axis should have an opening for the charged particle beam to transmit along the optical axis 2.

As mentioned above, the structure according to this embodiment is capable of applying the electric field in the direction of the Z axis in addition to the electric and magnetic fields in the directions of the X axis and the Y axis. Therefore, it is useful for minute observation and fabrication of a magnetic dielectric material (promising for high-function elements such as high-frequency filter and high-frequency antenna) which changes in properties in the coexistence of electric and magnetic fields.

Fifth Embodiment

According to this embodiment, the foregoing structure is modified (not shown) such that both the electric and magnetic fields are applied in the direction of the Z axis. This modification is accomplished by arranging the coil-pair 40Z (to apply the magnetic field in the direction of the Z axis) shown in FIG. 9 for the third embodiment and the parallel-plate electrode-pair 50Z (to apply the electric field in the direction of the Z axis) shown in FIG. 10 for the fourth embodiment, in such a way that they overlap with each other in the direction of the optical axis as in the case where the coil-pairs 40X and 40Y are arranged in the direction of the X axis and the parallel-plate electrode-pairs 50X and 50Y are arranged in the direction of the Y axis. In this case, the coil-pair 40Z and the parallel-plate electrode-pair 50Z, both arranged in the direction of the Z axis, should have an opening for the charged particle beam to transmit in the direction of the optical axis 2.

As mentioned above, the structure according to this embodiment is capable of applying the electric and magnetic fields in the direction of the Z axis in addition to the electric and magnetic fields in the directions of the X axis and the Y axis. Therefore, it is useful for minute observation and fabrication of a magnetic dielectric material (promising for high-function elements such as high-frequency filter and high-frequency antenna) which changes in properties in the coexistence of electric and magnetic fields.

Sixth Embodiment

Figure 11:
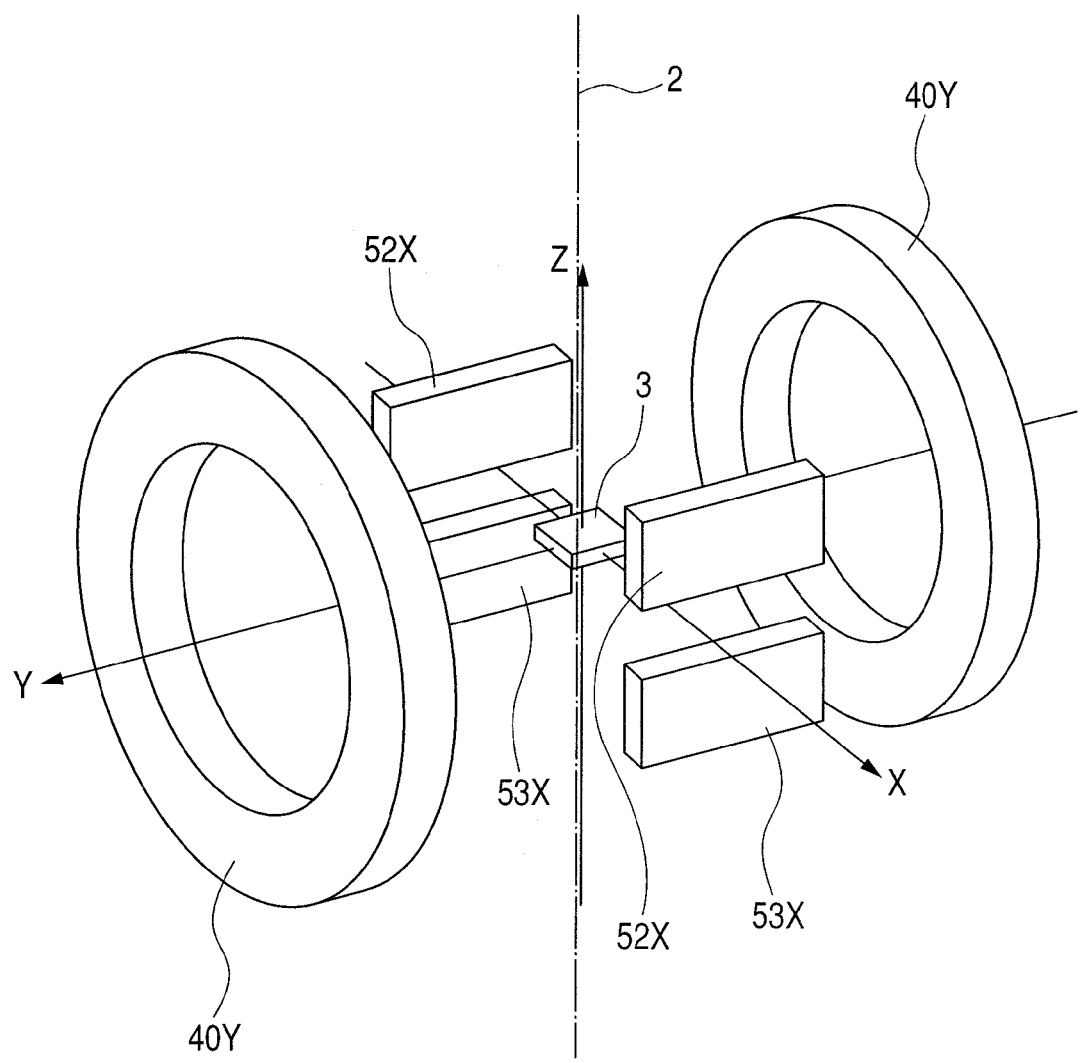
FIG. 11 is a schematic diagram illustrating the structure according to a sixth embodiment.

The structure according to a sixth embodiment of the present invention is schematically shown in FIG. 11. It consists of the coil-pair 40Y (which applies the magnetic field in the direction of the Y axis toward the spatial region containing the specimen 3) and two sets of the parallel-plate electrode-pairs 52X and 53X (which apply the electric field in the direction of the X axis toward two positions above and below the specimen 3 in the region of magnetic field). When the two sets of the parallel-plate electrode-pairs 52X and 53X apply a sufficiently strong electric field in the direction of the X axis, the charged particle beam is deflected in the direction opposite to that of deflection caused by the magnetic field. If the magnetic field is applied in the direction of the Y axis such that it sufficiently spreads in the direction of the Z axis, then the region of the magnetic field applied in the direction of the Y axis remains above and below the region of the electric field applied in the direction of the X axis. As the result, the charged particle beam undergoes deflection in five stages as follows: the first deflection away from the optical axis 2 which is caused by the magnetic field, the second deflection (in the opposite direction) toward the optical axis which is caused by the electric field, the third deflection away from the optical axis which is caused by the magnetic field applied to the specimen, the fourth deflection (in the opposite direction) toward the optical axis which is caused by the electric field, and the fifth deflection in the direction of the optical axis which is caused by the magnetic field.

Figure 12:
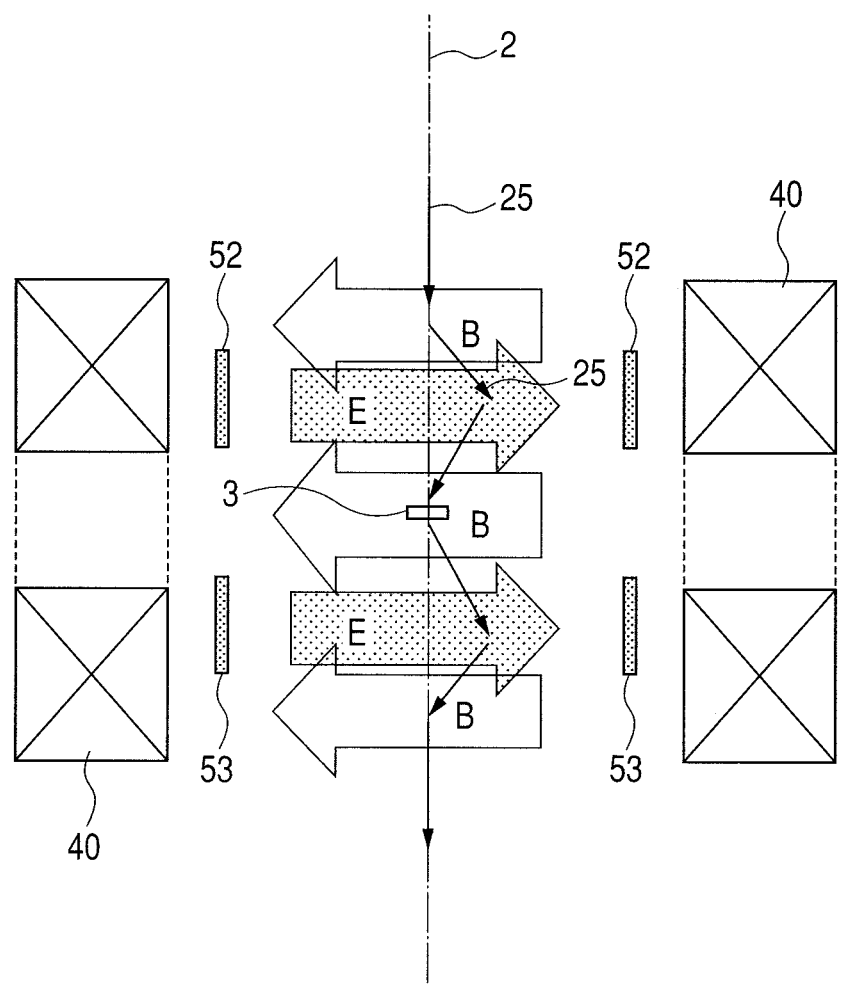
FIG. 12 is a schematic diagram illustrating the relationship between the electromagnetic field and the trajectory of a charged particle beam in the sixth embodiment.

FIG. 12 is a simplified diagram illustrating the magnetic field applied to the specimen 3 and the trajectory 25 of the charged particle beam. As in the case of FIG. 6, this diagram was drawn in such a way that the coil-pair 40 is turned by 90° around the optical axis 2 and is juxtaposed to the parallel-plate electrode-pair 50. The arrangement in this manner is characterized in that the deflection by the electric field overcomes the deflection by the magnetic field. As mentioned above, if the magnetic field is applied in the direction of the Y axis such that it sufficiently spreads in the direction of the Z axis, then the region of the magnetic field applied in the direction of the Y axis remains above and below the region of the electric field applied in the direction of the X axis. As the result, the charged particle beam undergoes deflection in five stages as follows: the first deflection away from the optical axis 2 which is caused by the magnetic field, the second deflection (in the opposite direction) toward the optical axis which is caused by the electric field, the third deflection away from the optical axis which is caused by the magnetic field applied to the specimen, the fourth deflection (in the opposite direction) toward the optical axis which is caused by the electric field, and the fifth deflection in the direction of the optical axis which is caused by the magnetic field.

Figure 13:
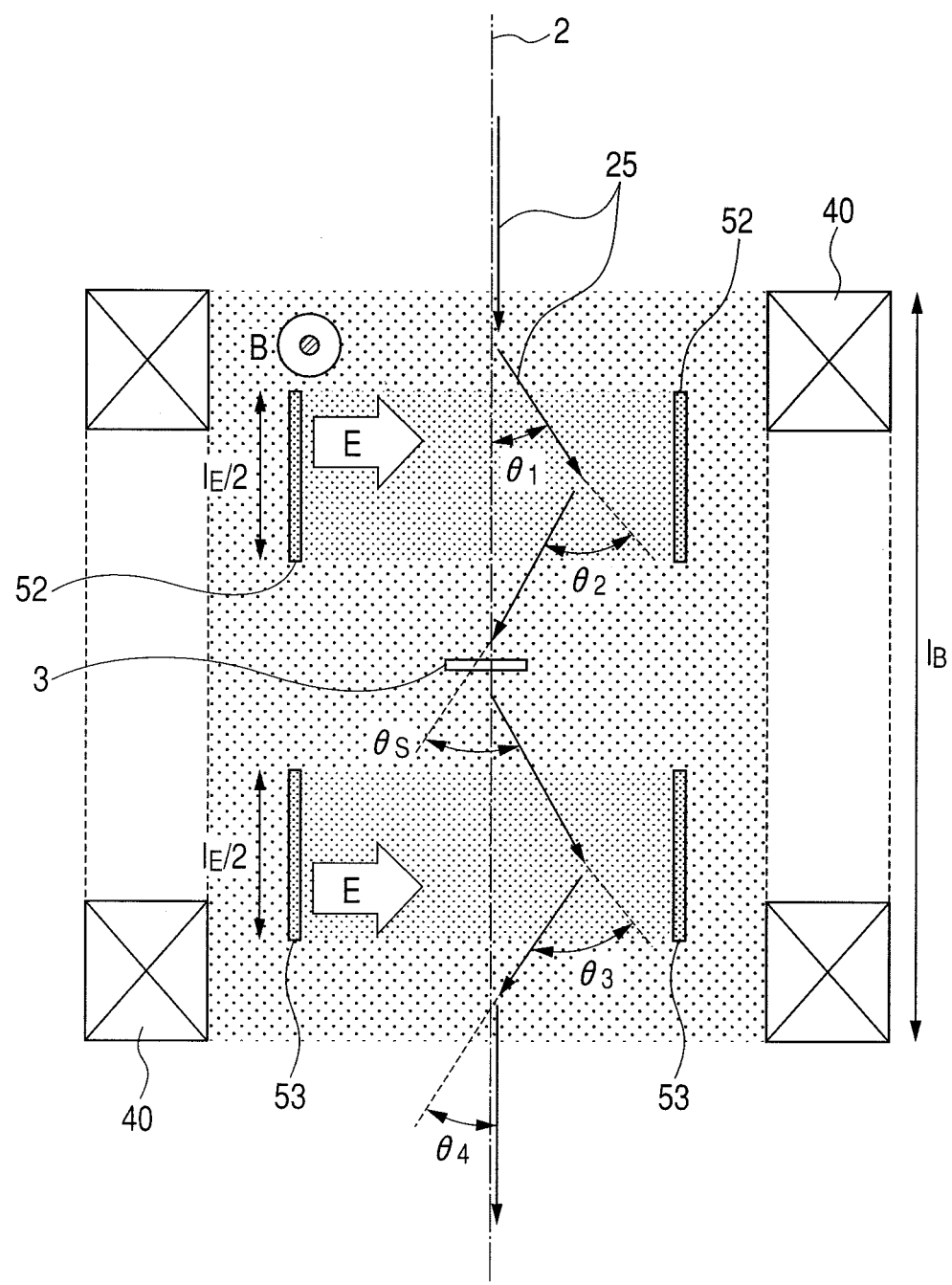
FIG. 13 is a schematic diagram illustrating the relationship between the electromagnetic field and the trajectory of a charged particle beam, the relationship being based on an assumption that the approximation of homogenous fields holds in the structure according to the sixth embodiment.

The following is a discussion about the condition for the deflection of a charged particle beam in a space where electromagnetic field is uniformly distributed. FIG. 13 depicts the regions of homogenous electromagnetic field and the deflection of the charged particle beam 25, the region of electric field existing above and below the specimen 3 in the region of magnetic field. The uniformly distributed magnetic field is realized by Helmholtz coils in practical use. Thus, the arrangement shown in FIG. 13 is not special but is fully practicable.

In FIG. 13, $\theta_1$ denotes the angle through which the charged particle beam 25 is deflected by the region of magnetic field remaining above the region of electric field applied by the parallel-plate electrode-pair 52; $\theta_2$ denotes the angle through which the charged particle beam 25 is deflected in the region of electric field (just above the specimen 3) applied by the parallel-plate electrode-pair 52; and $\theta_s$ denotes the angle through which the charged particle beam 25 is deflected in the region of magnetic field applied to the specimen 3 by the coil-pair 40. Likewise, $\theta_3$ and $\theta_4$ each denote the angle of deflection under the specimen 3 in the same way as above. The structure shown in FIG. 13 causes deflection in five stages with the angles $\theta_1, \theta_2$, and $\theta_s$ defined by the formulas 6 and 7 given in FIG. 4.

By applying the formulas 2 and 4 (which define the angles of deflection by magnetic and electric fields) to the structure shown in FIG. 13, one obtains the formulas 8, 9, and 10 (given in FIG. 4) that define the angles of deflection. By substituting the formulas 8, 9, and 10 into the formulas 6 and 7, one obtains the formula 11 given in FIG. 4.

The formula 11 implies that the structure for application of magnetic field shown in FIG. 13 causes the charged particle beam to be deflected in the same direction by electric field and magnetic field. In FIG. 13, the deflection by magnetic field takes place in the counterclockwise direction and the deflection by electric field takes place in the clockwise direction. In other words, the charged particle beam 25 proceeds in the direction of the optical axis before entrance into and after exit from the structure for application of magnetic field, without being affected by the structure for application of magnetic field.

Rearrangement of the formula 11 gives the formula 12 (given in FIG. 4) expressing the relation between electric field and magnetic field.

The formula 12 corresponds to the formula 5 representing Wien condition. This suggests that the electric field should be four times as large as the magnetic field if the width of the region of electric field is half the width of the region of magnetic field ($l_E = \frac{1}{2} l_B$) as depicted in FIG. 13. This is apparent from comparison between FIG. 6 and FIG. 13. In FIG. 13, the size of the parallel-plate electrode-pairs 52 and 53 in the direction of the optical axis 2 is half that of the coil-pair 40. This implies that the electric field should produce a deflection angle twice as large as that produced by the magnetic field so that the deflection of the charged particle beam 25 by the electric field overcomes that by the magnetic field.

Studies on the magnetic field application system as shown in FIG. 13 revealed that the apparatus for application of electric field (mentioned later) may be dealt with in the same way simply by exchanging the relation between electric field and magnetic field.

Figure 14A:
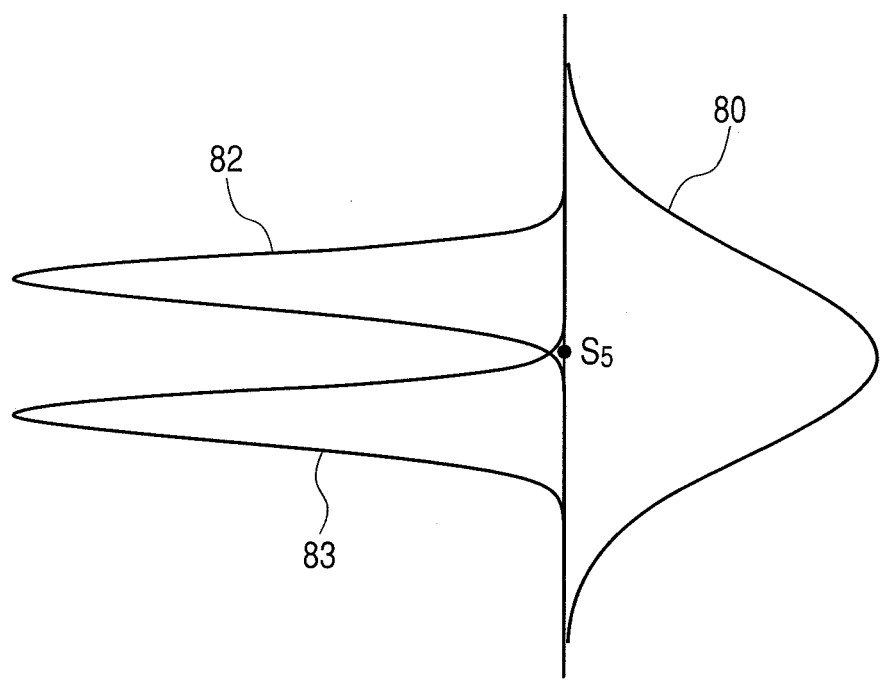
FIG. 14A is a schematic diagram illustrating the distribution of electric and magnetic fields in the structure according to the sixth embodiment.

FIG. 14A illustrates an instance in which the electromagnetic field varies in intensity from one place to another.

Figure 14B:
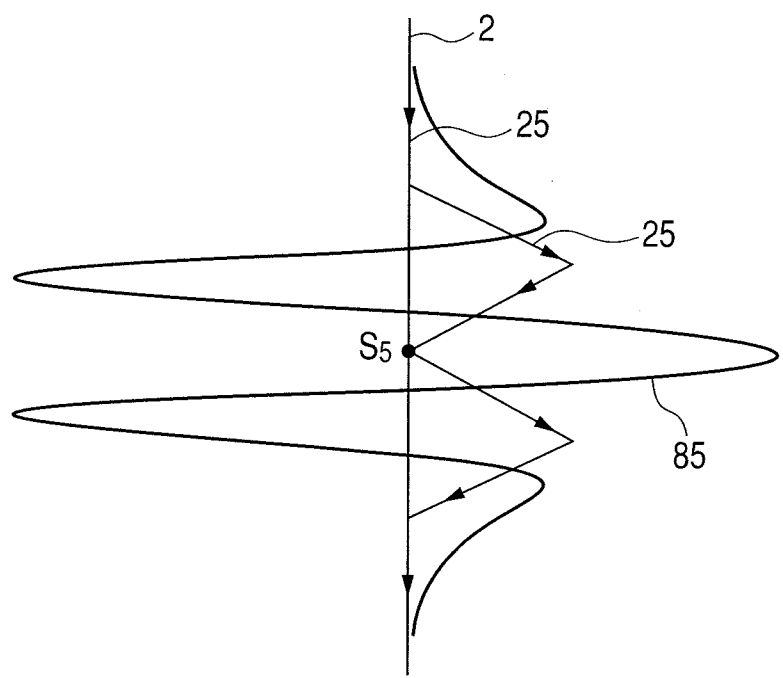
FIG. 14B is a schematic diagram illustrating the deflection of the trajectory of a charged particle beam, the deflection being due to the effect of electric field, the effect of magnetic field, and both of the effects of electric and magnetic fields, which are produced by the structure according to the sixth embodiment.

FIG. 14A is a schematic diagram illustrating the distribution of the electromagnetic field for deflection of the charged particle beam 25. In FIG. 14A, the curve 80 at the right side of the vertical line represents the distribution along the Z axis of the magnetic field applied to the specimen by the coil-pair 40Y arranged in the direction of the Y axis, and the curves 82 and 83 at the left side of the vertical line represent respectively the distribution along the Z axis of the electric field due to the parallel-plate electrode-pair 52X placed above the specimen and the distribution along the Z axis of the electric field due to the parallel-plate electrode-pair 53X placed below the specimen. The fact that the direction of deflection of the charged particle beam is reversed will be understood from the curves at the right (positive) and left (negative) sides of the Z axis. Since the charged particle beam undergoes deflection by magnetic field and deflection by electric field which are capable of linear combination (or proportional), the distribution 80 of magnetic field in the direction of the Z axis may be added to the distributions (82 and 83) of the electric field in the direction of the Z axis to give the combined and the effect of the deflection by the electric field and magnetic field is schematically shown as line 85 in FIG. 14B. In FIG. 14B, the arrow lines 25 represent the deflected trajectory of the charged particle beam. It is noted from FIG. 14B that the charged particle beam 25 in the single distribution of magnetic field may be deflected in the positive and negative directions by adequately selecting the position and intensity of the distributions (82 and 83) of the electric field.

Figure 15:
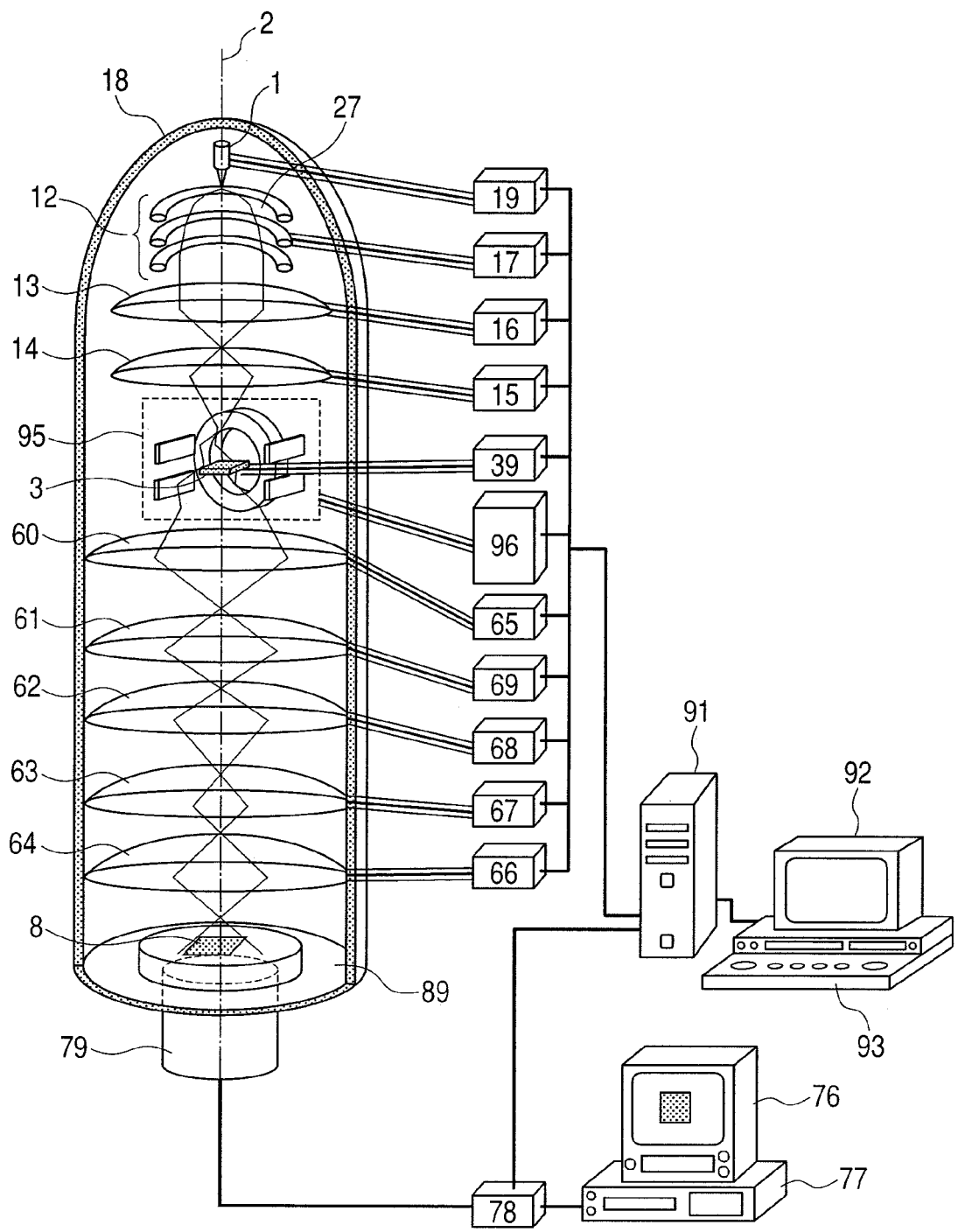
FIG. 15 is a schematic diagram illustrating the apparatus of an electron microscope incorporated with the structure for application of electric and magnetic fields which accords with the sixth embodiment.

FIG. 15 is a schematic diagram illustrating an electron microscope incorporated with the electromagnetic field application system 95 which is shown in FIG. 11. It is assumed that the electron microscope has the accelerating voltage of about 100 to 300 kV. The electromagnetic field application system 95 is placed above the objective lens 60 at which the magnetic field of the objective lens 60 produces no effect. The electron microscope shown in FIG. 15 has the lenses (13 and 14) for the condenser optical system and the lenses (61, 62, 63, and 64) for the enlarging imaging system as its constituents. However, it may have additional ones. There are shown in FIG. 15 the control unit 19 for the electron gun, the control unit 17 for the acceleration tube, the control unit 16 for the first irradiating lens, the control unit 15 for the second irradiating lens, the control unit 96 for the electromagnetic field application system, the control unit 39 for fine adjustment of the specimen, the control unit 65 for the objective lens, the control unit 69 for the first imaging lens, the control unit 68 for the second imaging lens, the control unit 67 for the third imaging lens, the control unit 66 for the fourth imaging lens, the observing and recording plane 89 on which the image 8 of the specimen is formed, the recording medium 79 for the image, the control unit 78 for the image observing and recording medium, the image recording apparatus 77, the image displaying apparatus 76, the computer 91 to control the entire system of the electron microscope, the monitor 92 of the control computer 92, and the interface 93 for the control computer. The foregoing is a mere example, and it may be modified and changed according to need. The electron microscope in actual use has, in addition to the foregoing constituents shown in FIG. 15, the deflecting system to control the advancing direction of the electron beam 27 and the aperture to restrict the region for the electron beam to transmit. These devices, however, are omitted in FIG. 15 because they have nothing to do with the present invention. Moreover, the electron optical system is assembled in the vacuum container 18 which is continuously evacuated by a vacuum pump. The vacuum system is omitted here because it has nothing to do with the present invention.

Although the charged particle beam 25 is deflected in five stages in this embodiment, the number of stages may be seven or nine so long as deflection takes place symmetrically upward and downward about the intersection of the optical axis with the specimen.

Seventh Embodiment

Figure 16:
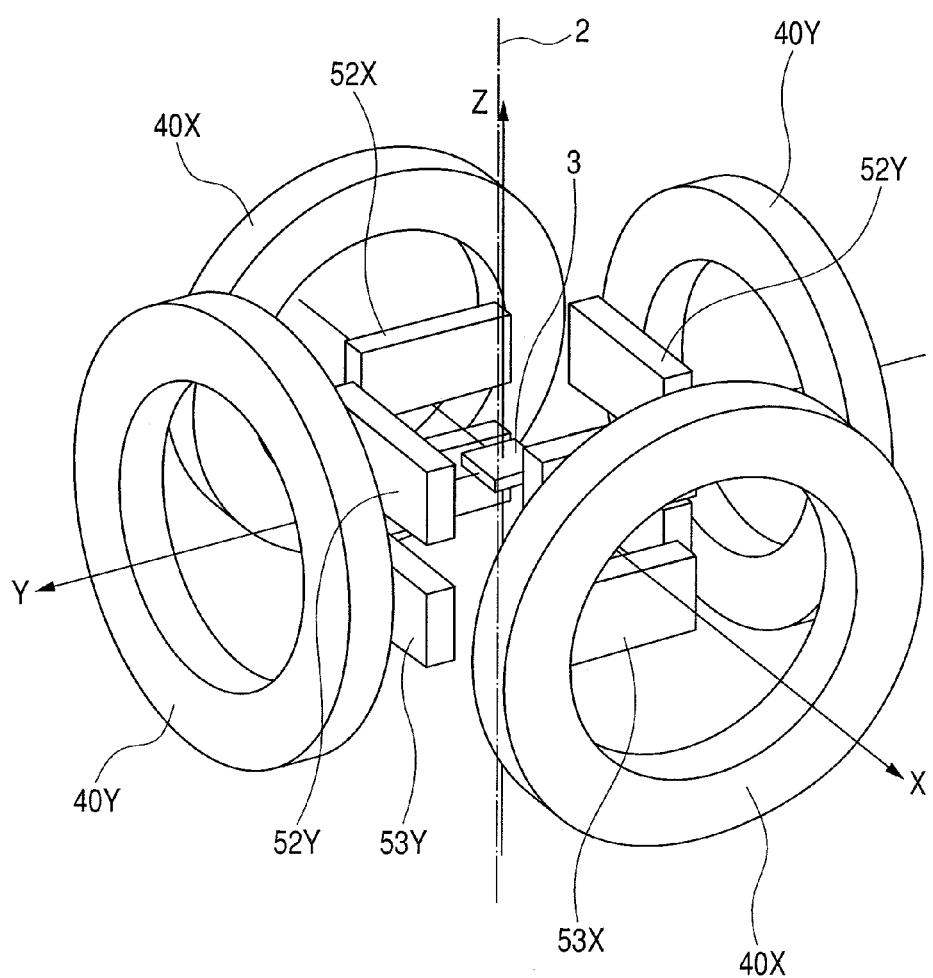
FIG. 16 is a schematic diagram illustrating the structure according to a seventh embodiment.

The structure according to a seventh embodiment is schematically shown in FIG. 16. It is similar to that according to the sixth embodiment as shown in FIG. 12. It has two sets of the coil-pairs (40X and 40Y) arranged in the direction of the X axis and the Y axis. It also has two sets of the parallel-plate electrode-pairs (52X, 53X) and (52Y, 53Y) arranged in the direction of the X axis and the Y axis. With a sufficiently strong electric field applied, these parallel-plate electrode-pairs (52X, 53X) and (52Y, 53Y) bring about deflection in the opposite direction of the magnetic field. As the result, deflection in five stages can be realized. The foregoing structure permits the electromagnetic field to be applied in any desirable direction in the plane perpendicular to the optical axis if the electric and magnetic fields are adjusted in the directions of the X axis and the Y axis.

The structure according to this embodiment is capable of applying the magnetic field in any desirable direction of the X axis and the Z axis. Therefore, it is useful for minute observation and fabrication of high-function elements, such as spintronics elements, that employ magnetic mutual action and those materials for them, which change in properties in the presence of magnetic field.

Eighth Embodiment

Figure 17:
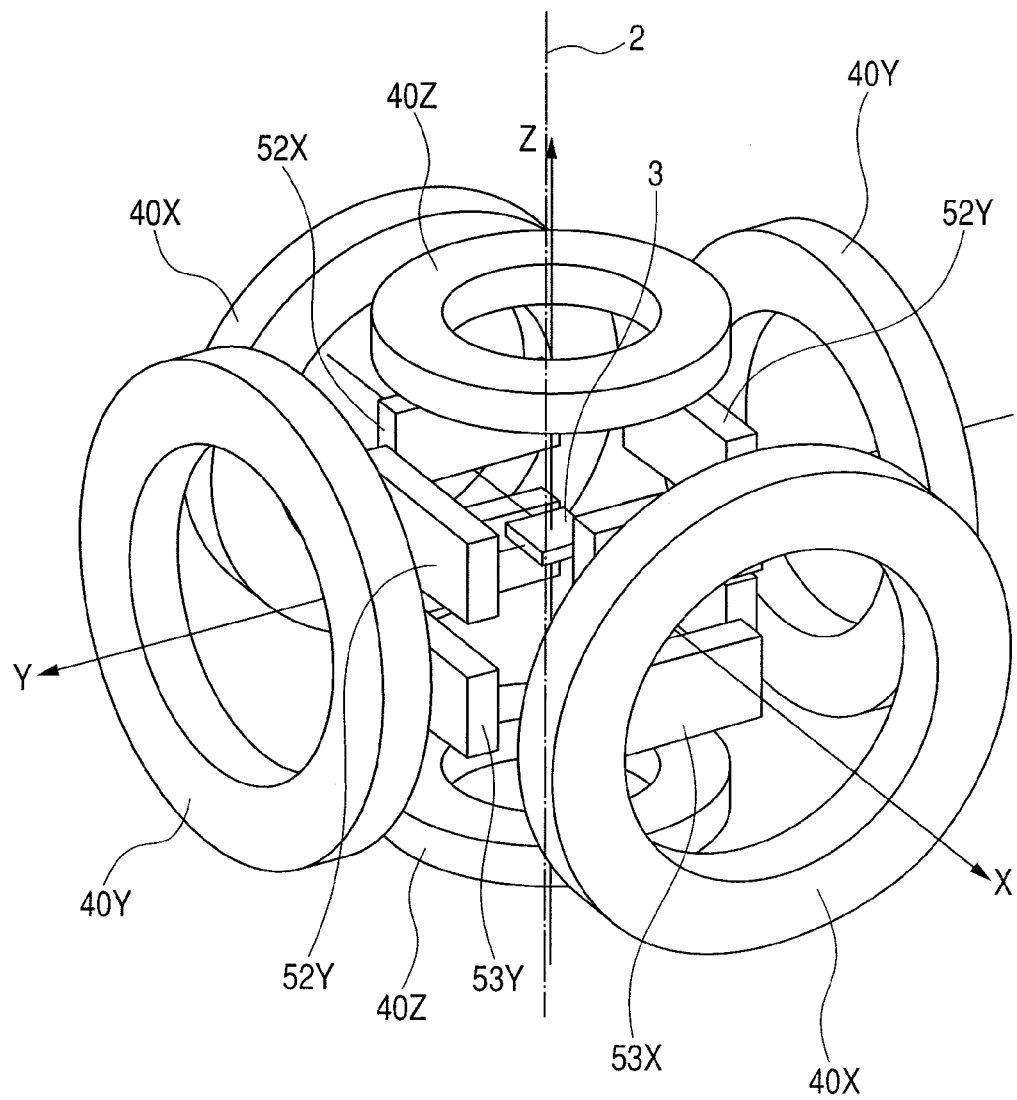
FIG. 17 is a schematic diagram illustrating the structure according to an eighth embodiment.

The structure according to an eighth embodiment is schematically shown in FIG. 17. It is similar to that according to the seventh embodiment but different in being additionally incorporated with the coil-pair 40Z arranged parallel to the optical axis 2. Thus it is capable of applying magnetic field to the specimen in the direction of the Z axis. It does not need any mechanism for correction because the magnetic field parallel to the optical axis 2 does not greatly deflect the charged particle beam like the electromagnetic lens. The coil-pair 40Z that applies magnetic field in the direction of the Z axis needs an opening for the charged particle beam to transmit along the optical axis 2 unless the coil is coreless.

The foregoing structure may be modified (not shown) such that both the electric and magnetic fields are applied in the direction of the Z axis. This modification is accomplished by arranging the parallel-plate electrode-pair to apply the electric field in the direction of the Z axis (as depicted in FIG. 10 of the fourth embodiment) or by arranging both the parallel-plate electrode-pair and the coil-pair to apply the magnetic field in the direction of the Z axis in such a way that they overlap with each other in the direction of the optical axis as in the case where the coil-pairs and the parallel-plate electrode-pairs are arranged in the directions of the X axis and Y axis. In this case, the coil-pair and the parallel-plate electrode-pair, both arranged in the direction of the Z axis, need an opening for the charged particle beam to transmit along the optical axis.

The structure according to this embodiment is capable of applying the magnetic field in any desirable direction of the X axis and the Y axis. In addition, it is also capable of applying the electromagnetic field in the direction of the Z axis. Therefore, it is useful for minute observation and fabrication of high-function elements, such as spintronics elements, that employ magnetic mutual action and those materials for them, which change in properties in the presence of magnetic field, and it is also useful for minute observation and fabrication of a magnetic dielectric material (promising for high-function elements such as high-frequency filter and high-frequency antenna elements) which changes in properties in the coexistence of electric and magnetic fields.

Ninth Embodiment

Figure 18:
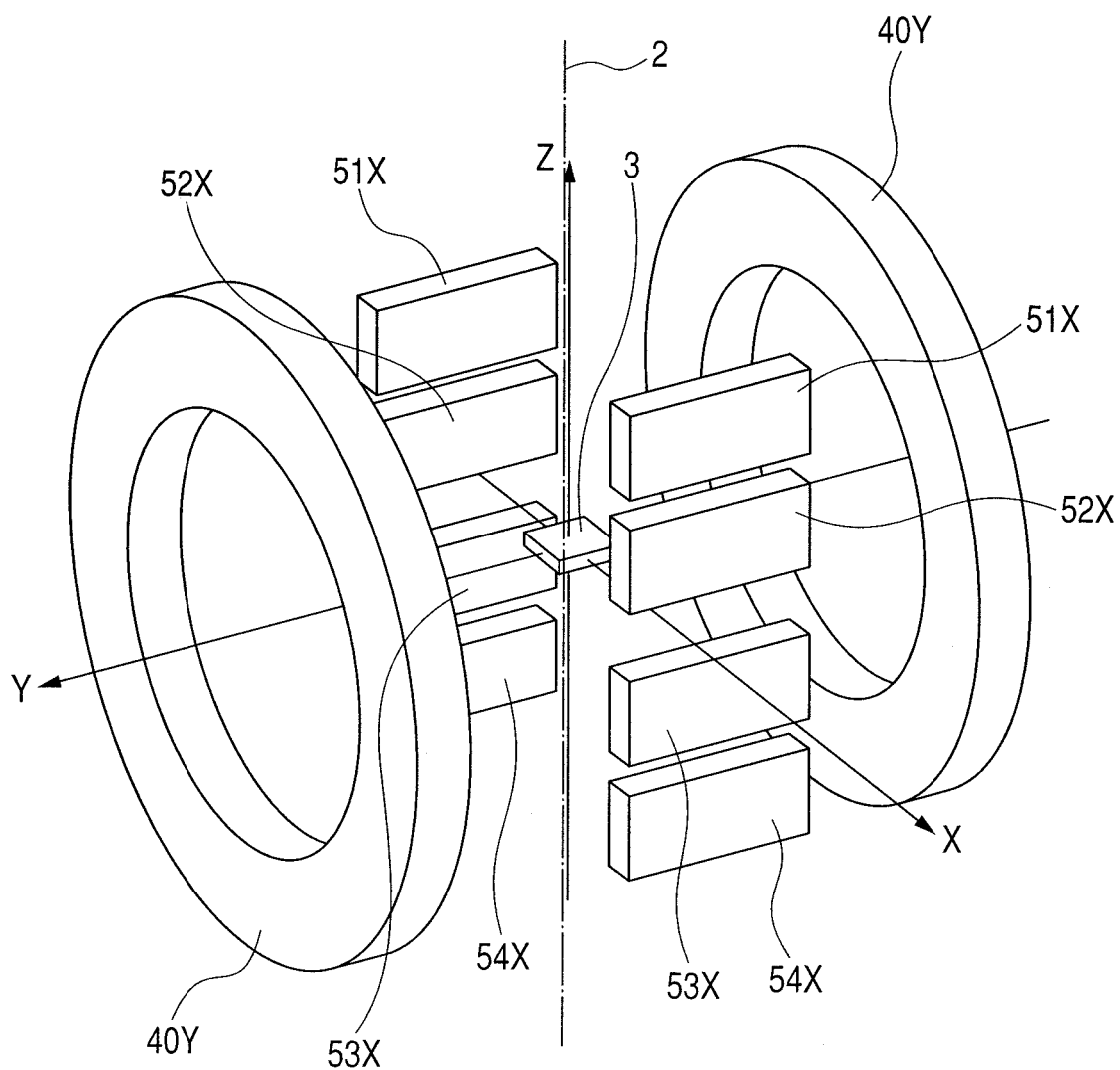
FIG. 18 is a schematic diagram illustrating the structure according to a ninth embodiment.

The structure according to a ninth embodiment of the present invention is schematically shown in FIG. 18. It has the coil-pair 40Y which applies the magnetic field in the direction of the Y axis in the spatial region containing the specimen 3. It also has four sets of the parallel-plate electrode-pairs (51X, 52X, 53X, and 54X), with two sets each being arranged above and below the specimen 3 in the region of the magnetic field, which apply the electric field in the direction of the X axis. These parallel-plate electrode-pairs are able to control the direction of deflection in four stages independently of the magnetic field applied to the specimen. Thus the structure permits the charged particle beam to be controlled more accurately than that in the sixth embodiment shown in FIG. 11. The structure in this embodiment is similar to that in the sixth embodiment in that the parallel-plate electrode-pair (52X) just above the specimen and the parallel-plate electrode-pair (53X) just below the specimen should apply an electric field stronger than necessary to cancel the deflection of the charged particle beam caused by the magnetic field applied. However, the parallel-plate electrode-pairs 51X and 54X which are placed at the uppermost and lowermost positions, respectively, produce the desired deflection with their relatively weak electric fields because the direction of deflection by the electric field coincides with the direction of deflection by the magnetic field at the uppermost and lowermost positions.

Figure 19:
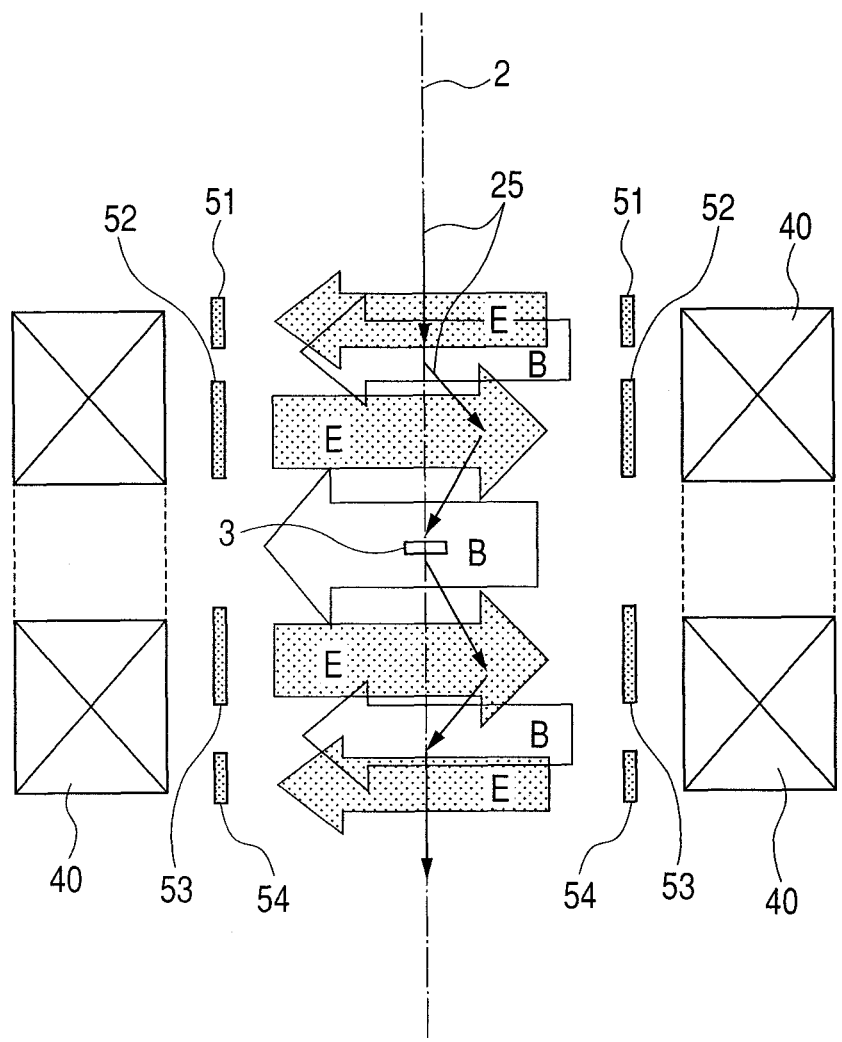
FIG. 19 is a schematic diagram illustrating the relationship between the electromagnetic field and the trajectory of a charged particle beam in the ninth embodiment.

FIG. 19 is a simplified diagram illustrating the trajectory 25 of the charged particle beam and the magnetic field applied to the specimen 3. As in the case of FIGS. 6 and 12, this diagram was drawn in such a way that the coil-pair 40 is turned by 90° around the optical axis 2 and is juxtaposed to the parallel-plate electrode-pair 50. The parallel-plate electrode-pairs (52 and 53) just above and below the specimen should apply an electric field stronger than necessary to cancel the deflection of the charged particle beam caused by the magnetic field applied. However, the parallel-plate electrode-pairs (51 and 54) which are placed at the uppermost and lowermost positions, respectively, produce the desired deflection with their relatively weak electric fields because the direction of deflection by the electric field coincides with the direction of deflection by the magnetic field at the uppermost and lowermost positions.

For deflection to take place in an arbitrary direction in the plane perpendicular to the optical axis, there is the necessity for the coil-pair and parallel-plate electrode-pairs which generate respectively electromagnetic field in the directions of the X axis and Y axis, as in the case of FIG. 16. In addition, for application of electromagnetic field in the direction of the Z axis, there is the necessity for the coil-pair and parallel-plate electrode-pair as in the eighth embodiment, as a matter of course.

The structure according to this embodiment is capable of applying the magnetic field in any desirable direction of the X axis and the Y axis. In addition, it is also capable of applying the electromagnetic field in the direction of the Z axis. Therefore, it is useful for minute observation and fabrication of high-function elements, such as spintronics elements, that employ magnetic mutual action and those materials for them, which change in properties in the presence of magnetic field, and it is also useful for minute observation and fabrication of a magnetic dielectric material (promising for high-function elements such as high-frequency filter and high-frequency antenna elements) which changes in properties in the coexistence of electric and magnetic fields.

Tenth Embodiment

Figure 20:
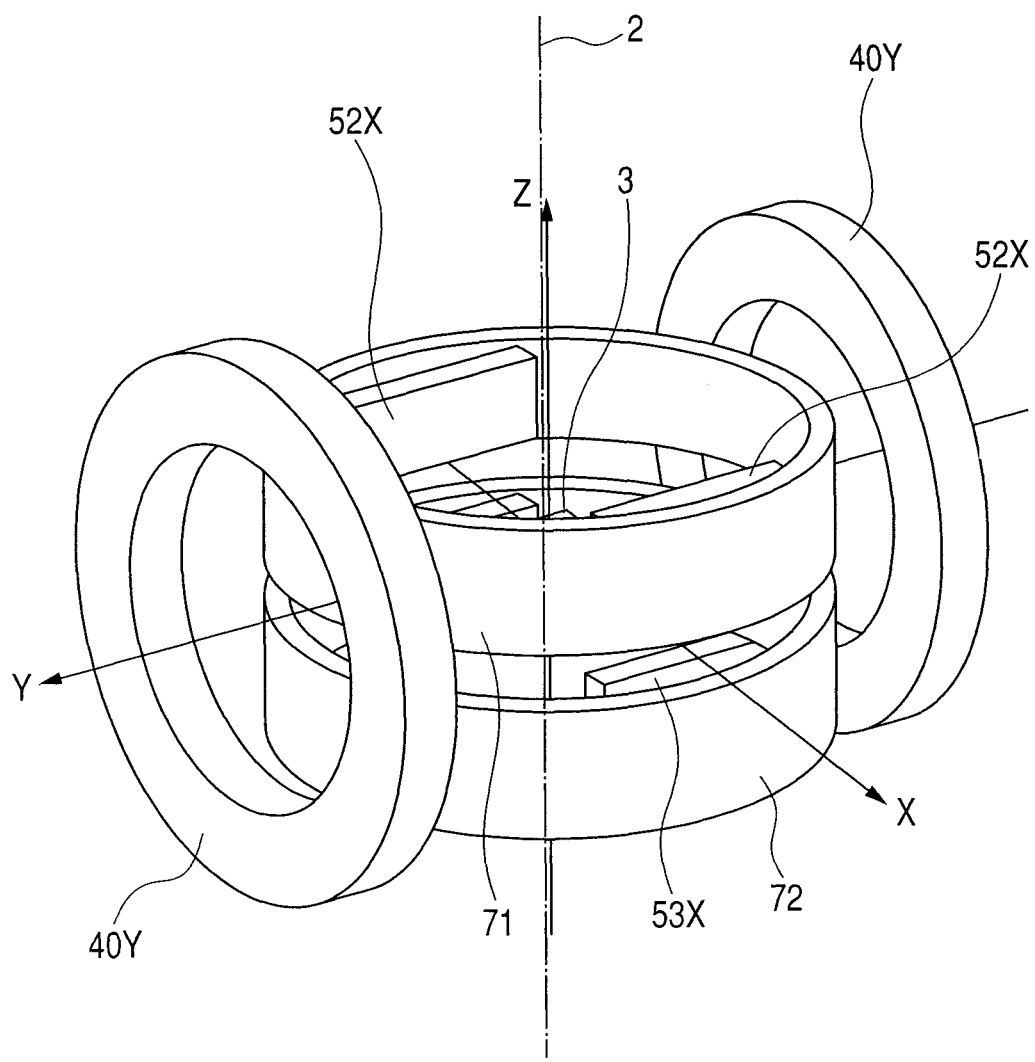
FIG. 20 is a schematic diagram illustrating the structure according to a tenth embodiment.

The structure according to a tenth embodiment of the present invention is schematically shown in FIG. 20. It is similar to that in the ninth embodiment (shown in FIG. 18) in having the parallel-plate electrode-pairs (52X and 53X) which apply the electric field for deflection in two stages above and below the specimen 3. However, it has the magnetic shields (71 and 72) around the parallel-plate electrode-pairs (52X and 53X), so that they prevent the magnetic field applied to the specimen 3 from infiltrating into the parallel-plate electrode-pairs (52X and 53X) and also enhances the effect of deflection by the electric field. This structure permits the system for deflection (or the parallel-plate electrode-pairs 52X and 53X) above and below the specimen to work independently of the magnetic field applied to the specimen 3.

Figure 21:
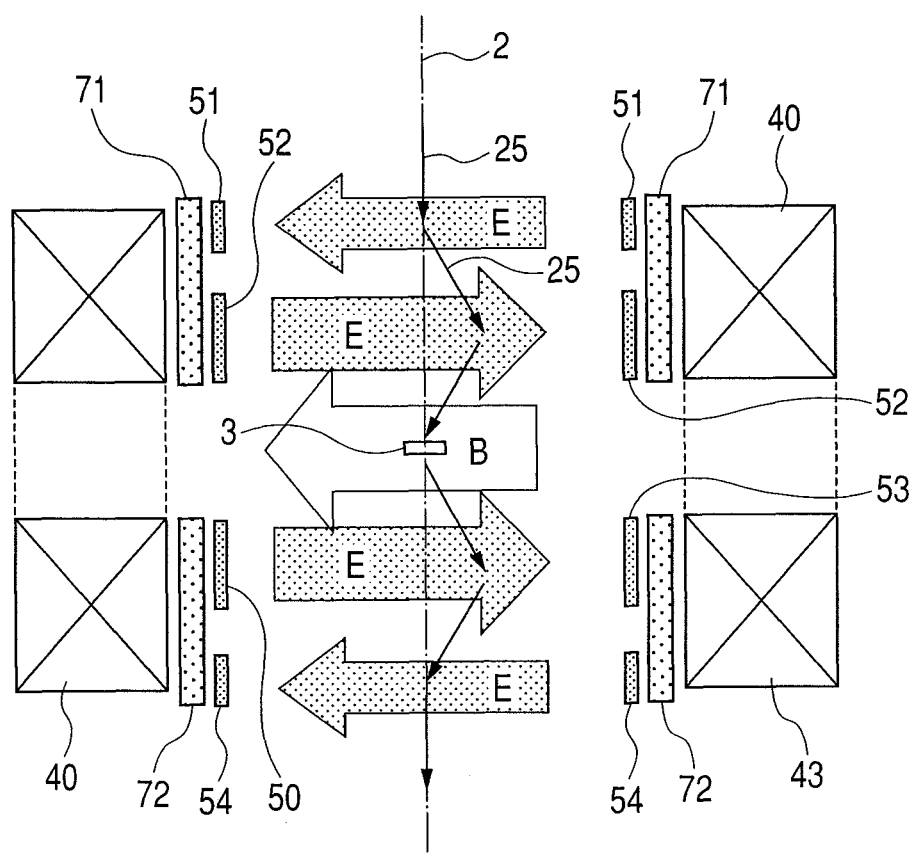
FIG. 21 is a schematic diagram illustrating the relationship between the electromagnetic field and the trajectory of a charged particle beam in the tenth embodiment.

FIG. 21 is a schematic diagram illustrating the magnetic field applied to the specimen 3 and the trajectory of the charged particle beam 25. The parallel-plate electrode-pairs (52 and 53) just above and below the specimen 3 produce the desired effect of deflection with weaker electric fields than in the ninth embodiment because the action of deflection of the charged particle beam 25 by the magnetic field applied to the specimen 3 is precluded by the magnetic shields (71 and 72). Instead, the parallel-plate electrode-pairs (51 and 54) at the uppermost and lowermost positions should generate stronger electric fields than in the ninth embodiment because the magnetic field for deflection is not utilized at such positions.

Eleventh Embodiment

Figure 22:
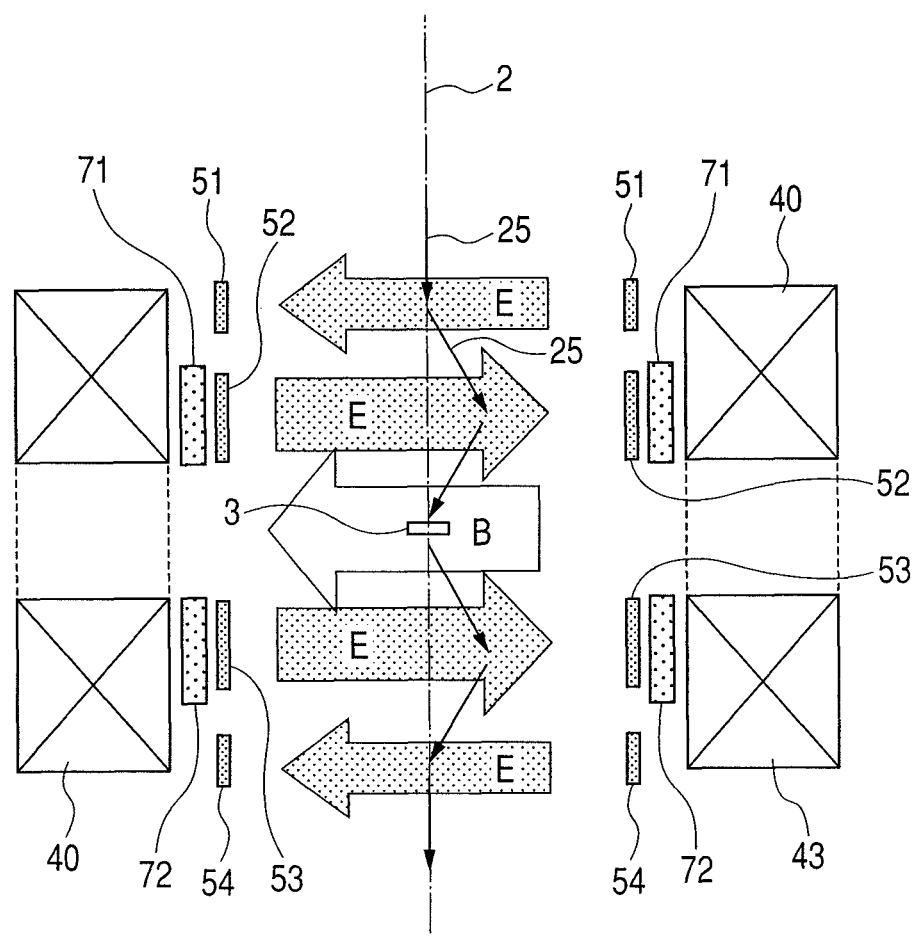
FIG. 22 is a schematic diagram illustrating the relationship between the electromagnetic field and the trajectory of a charged particle beam in an eleventh embodiment.

FIG. 22 is a simplified diagram illustrating the electromagnetic field and the trajectory of the charged particle beam 25 in an eleventh embodiment, which has the magnetic shields (71 and 72) arranged around only the parallel-plate electrode-pairs 52 and 53 just above and below the specimen, respectively. This arrangement produces the desired effect of deflection with a weaker electric field applied than in the ninth embodiment because the parallel-plate electrode-pairs 52 and 53 just above and below the specimen are exempt from the effect of magnetic field. Moreover, the parallel-plate electrode-pairs 51 and 54 at the uppermost and lowermost positions of the apparatus can utilize the effect of deflection by the magnetic field applied to the specimen by the coil-pair 40 and hence they achieve the desired deflection with a relatively weaker electric field.

Since either of the parallel-plate electrode-pairs produce the desired effect of deflection with a relatively weaker electric field, the apparatus for application of electric field according to this embodiment is effective for the charged particle beam of high accelerating voltage which cannot be readily deflected by an electric field.

Sixth to eleventh embodiments mentioned above are concerned with the magnetic field application system to the specimen. The same idea for them can be immediately applied to the apparatus for application of electric field simply by exchanging the coil-pair and the parallel-plate electrode-pair, in which case the relative position of the electric field and the magnetic field replaces each other in the optical system. The following description is about the apparatus for application of electric field. The plate electrodes may be made of such non-magnetic material as copper and aluminum, or any other materials.

Twelfth Embodiment

Figure 23:
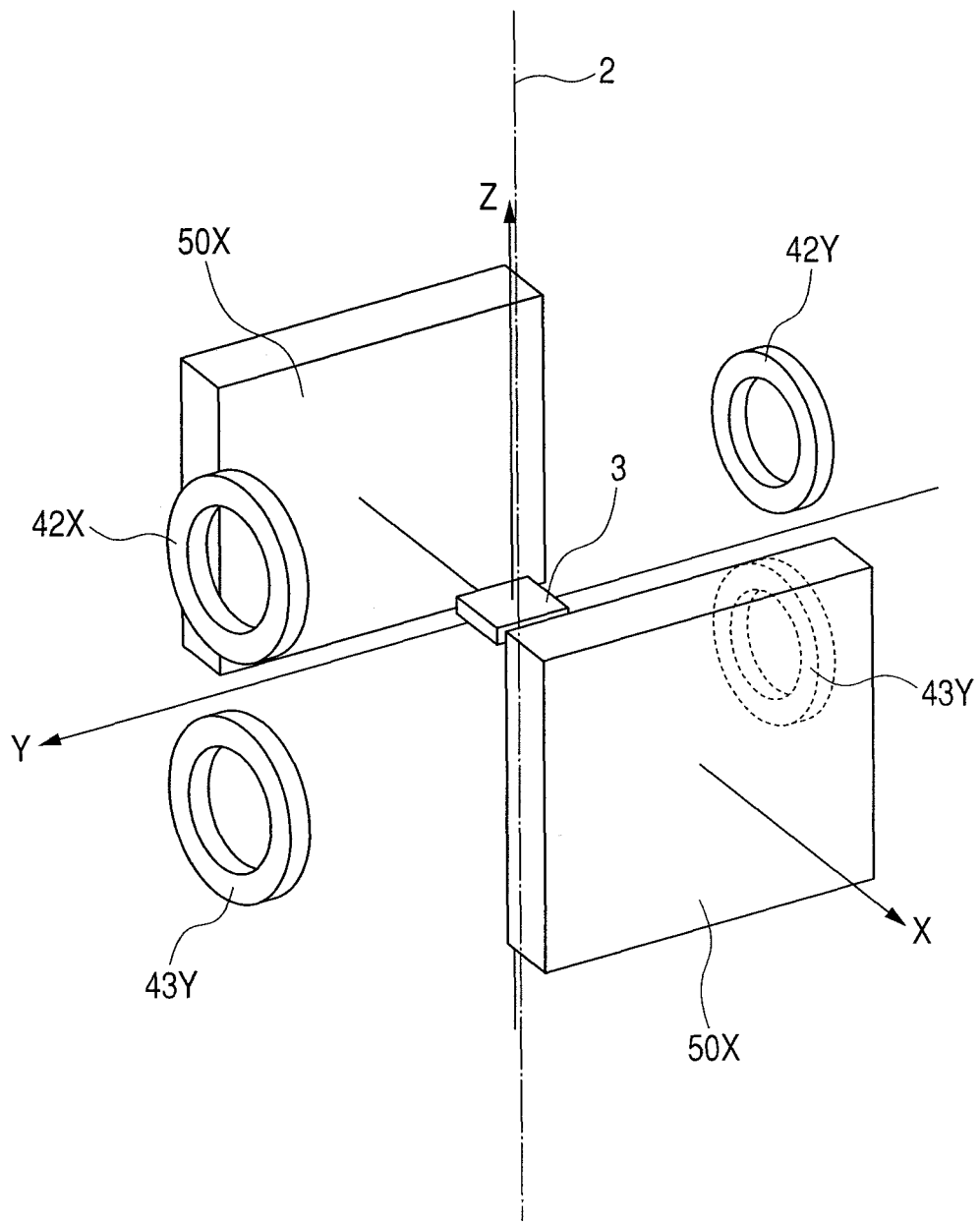
FIG. 23 is a schematic diagram illustrating the structure according to a twelfth embodiment.

A twelfth embodiment of the present invention is schematically shown in FIG. 23. In this embodiment, the relative position of the coil-pair and the parallel-plate electrode-pair, which are shown in FIG. 12, is exchanged. The parallel-plate electrode-pair 50X apply an electric field in the direction of the X axis in the region containing the specimen 3. Two sets of the coil-pair (42Y and 43Y) having the magnetic axis parallel to the Y axis are arranged above and below the specimen 3 in the region of the electric field, so that the magnetic field is applied in the direction of the Y axis. When the two sets of the coil-pair (42Y and 43Y) apply a sufficiently strong magnetic field in the direction of the Y axis, the charged particle beam in the region of the applied magnetic field is deflected in the direction opposite to the direction of the electric field applied by the parallel-plate electrode-pair 50X. If this occurs in such a way that the region of the magnetic field applied in the direction of the Y axis sufficiently spreads in the direction of the Z axis, the region of the electric field applied in the direction of the X axis remains above and below the region of the magnetic field in the direction of the Y axis. As the result, the charged particle beam undergoes deflection downward in five stages as follows: the first deflection away from the optical axis 2 which is caused by the electric field, the second deflection (in the opposite direction) toward the optical axis 2 which is caused by the magnetic field, the third deflection away from the optical axis 2 which is caused by the electric field applied to the specimen 3, the fourth deflection (in the opposite direction) toward the optical axis 2 which is caused by the magnetic field, and the fifth deflection in the direction of the optical axis 2 which is caused by the electric field.

Figure 24:
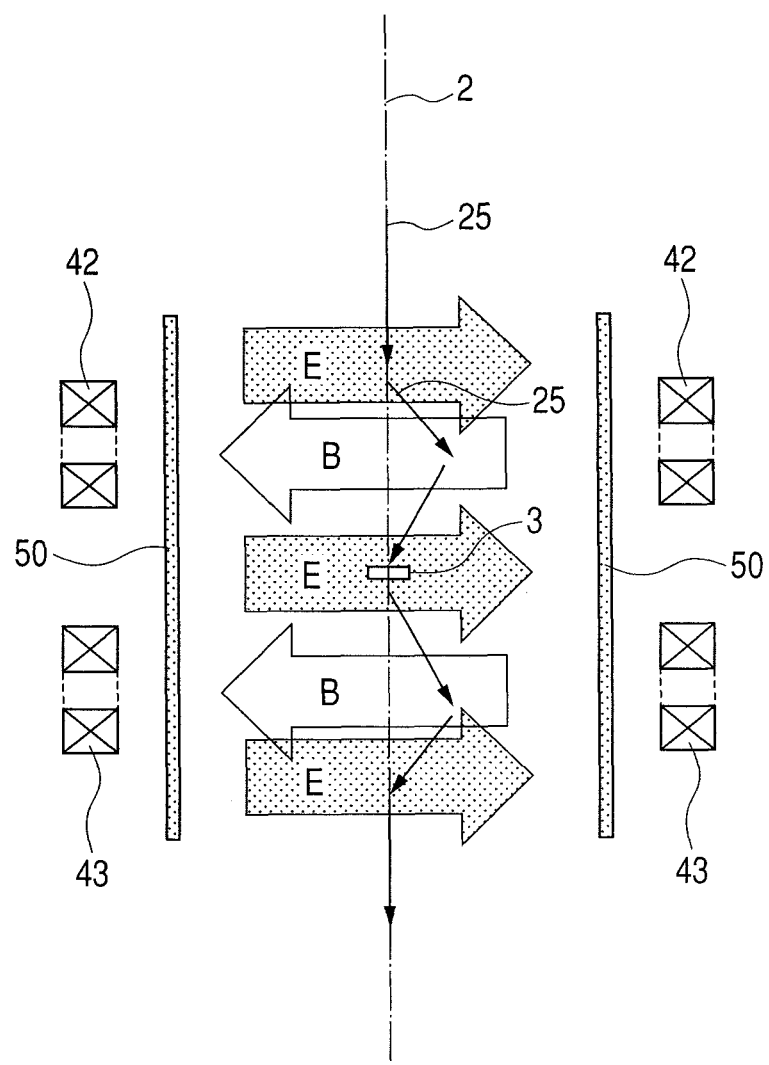
FIG. 24 is a schematic diagram illustrating the relationship between the electromagnetic field and the trajectory of a charged particle beam in the twelfth embodiment.

FIG. 24 is a simplified diagram illustrating the electric field applied to the specimen 3 and the trajectory 25 of the charged particle beam. As in the case of FIG. 6, this diagram was drawn in such a way that the coil-pairs (42 and 43) are turned by 90° around the optical axis 2 and are juxtaposed to the parallel-plate electrode-pair 50. The arrangement in this manner is characterized in that the deflection by the magnetic field overcomes the deflection by the electric field. If the position and intensity of the distribution of the magnetic field are properly selected, the charged particle beam can be deflected in the positive and negative directions in the region of the single electric field applied by the parallel-plate electrode-pair 50. As mentioned above, if the region of the electric field applied in the direction of the X axis sufficiently spreads in the direction of the Z axis, the region of the electric field applied in the direction of the X axis remains above and below the region of the magnetic field applied in the direction of the Y axis. As the result, the charged particle beam undergoes deflection downward in five stages as follows: the first deflection away from the optical axis 2 which is caused by the electric field, the second deflection (in the opposite direction) toward the optical axis 2 which is caused by the magnetic field, the third deflection away from the optical axis 2 which is caused by the electric field applied to the specimen 3, the fourth deflection (in the opposite direction) toward the optical axis 2 which is caused by the magnetic field, and the fifth deflection in the direction of the optical axis 2 which is caused by the electric field.

Thirteenth Embodiment

Figure 25:
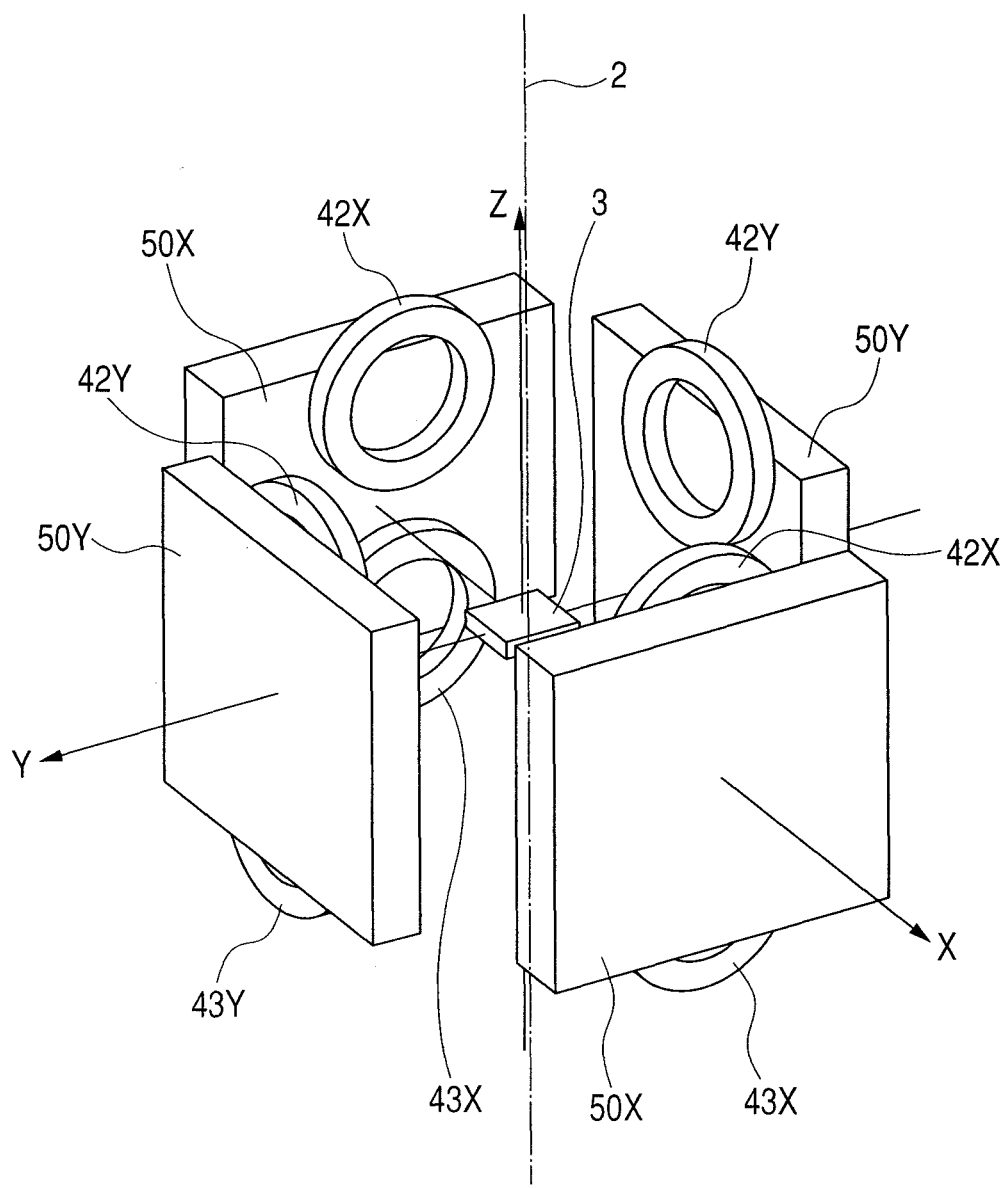
FIG. 25 is a schematic diagram illustrating the structure according to a thirteenth embodiment.

A thirteenth embodiment of the present invention is schematically shown in FIG. 25. It is constructed such that the coil-pair and the parallel-plate electrode-pairs shown in FIG. 16 are exchanged as explained below. Two sets of the parallel-plate electrode-pairs 50X and 50Y apply respectively electric fields in the directions of the X axis and the Y axis in the region containing the specimen 3. Four sets of the coil-pair (42X, 43X) and (42Y, 43Y) having respectively the magnetic axis parallel to the X axis and the Y axis are arranged above and below the specimen 3 in the region of the electric field. This arrangement differs from that shown in FIG. 16 in that the four sets of the coil-pair (42X, 43X) and (42Y, 43Y) are arranged inside (close to the optical axis) the parallel-plate electrode-pairs (50X and 50Y). Since the coils are usually composed of bobbins and wires of metallic material, they produce the effect of shielding the electric field applied (parallel to the coil) by the parallel-plate electrode-pair arranged outside them. In other words, the foregoing configuration functions as the magnetic shield in the same way as that attached to the magnetic field application system according to the tenth embodiment. It is expected to shield the charged particle beam against the electric field.

Figure 26:
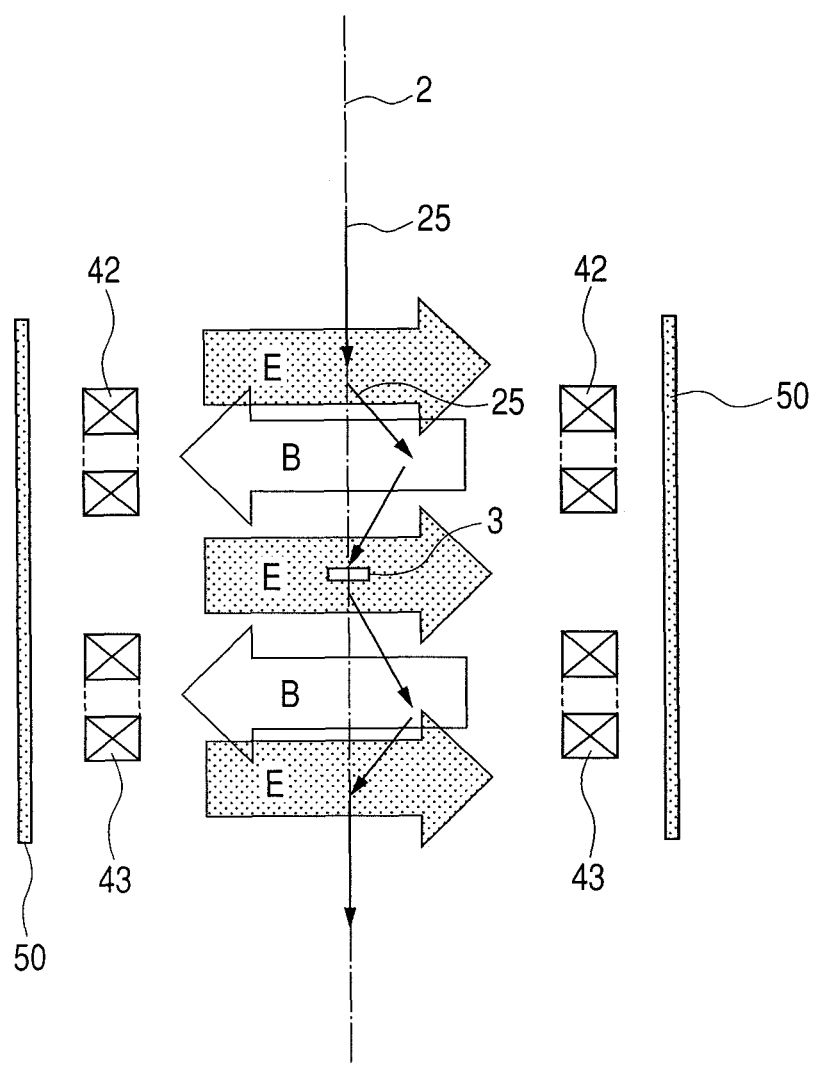
FIG. 26 is a schematic diagram illustrating the relationship between the electromagnetic field and the trajectory of a charged particle beam in the thirteenth embodiment.

FIG. 26 is a simplified diagram illustrating the electric field applied to the specimen 3 and the trajectory 25 of the charged particle beam. As in the case of FIG. 6, this diagram was drawn in such a way that the coil-pair of 42 and 43 is turned by 90° around the optical axis 2 and is juxtaposed to the parallel-plate electrode-pair 50. The arrangement in this manner is characterized in that the deflection by the magnetic field is realized by the coil-pair of 42 and 43 independently of that by the electric field. Therefore, if the position and intensity of the distribution of the magnetic field are properly selected, the charged particle beam can be deflected in five stages. As mentioned above, if the region of the electric field applied in the directions of the X axis and the Y axis sufficiently spreads in the direction of the Z axis, the region of the electric field applied in the directions of the X axis and the Y axis remains above and below the region of the magnetic field applied in the directions of the X axis and the Y axis. As the result, the charged particle beam 25 undergoes deflection downward in five stages as follows: the first deflection away from the optical axis 2 which is caused by the electric field, the second deflection (in the opposite direction) toward the optical axis 2 which is caused by the magnetic field, the third deflection away from the optical axis 2 which is caused by the magnetic field applied to the specimen 3, the fourth deflection (in the opposite direction) toward the optical axis 2 which is caused by the magnetic field, and the fifth deflection in the direction of the optical axis 2 which is caused by the electric field. The application of electromagnetic field in the direction of the Z axis will be readily accomplished by arranging the coil-pair and parallel-plate electrode-pairs above and below the specimen as in the case of the fifth and eighth embodiments. In this case, the coil-pairs and parallel-plate electrode-pairs arranged in the direction of the Z axis should have an opening for the charged particle beam to transmit along the optical axis.

Fourteenth Embodiment

Figure 27:
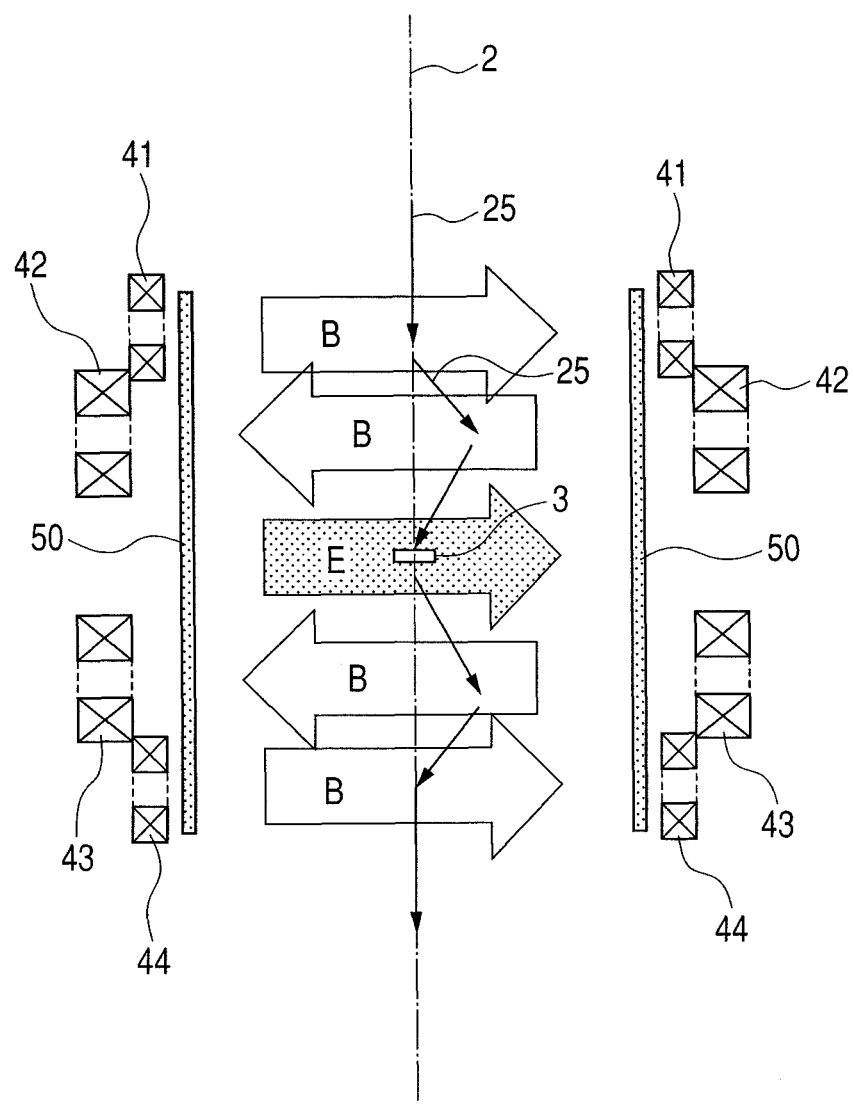
FIG. 27 is a schematic diagram illustrating the relationship between the electromagnetic field and the trajectory of a charged particle beam in a fourteenth embodiment.

A fourteenth embodiment of the present invention is schematically shown in FIG. 27. It is constructed such that the magnetic field and the electric field are exchanged, unlike those shown in FIG. 19 (ninth embodiment), with the parallel-plate electrode-pair 50 being arranged inside the coil-pair (41, 42, 43, and 44) or close to the optical axis 2. In other words, the coil-pair (41 and 42) is arranged in two tiers above the specimen 3 and the coil-pair (43 and 44) is arranged in two tiers below the specimen 3. The arrangement realizes the deflection in five stages. Moreover, this arrangement permits the metallic coil to produce the effect of shielding the electric field, as in the thirteenth embodiment.

As in the thirteenth embodiment, there is the possibility of adding the coil-pair and parallel-plate electrode-pair for application of magnetic and electric fields in both the directions of the X axis and Y axis or adding the coil-pair and parallel-plate electrode-pair for application of electromagnetic field in the direction of the Z axis.

Fifteenth Embodiment

Figure 28:
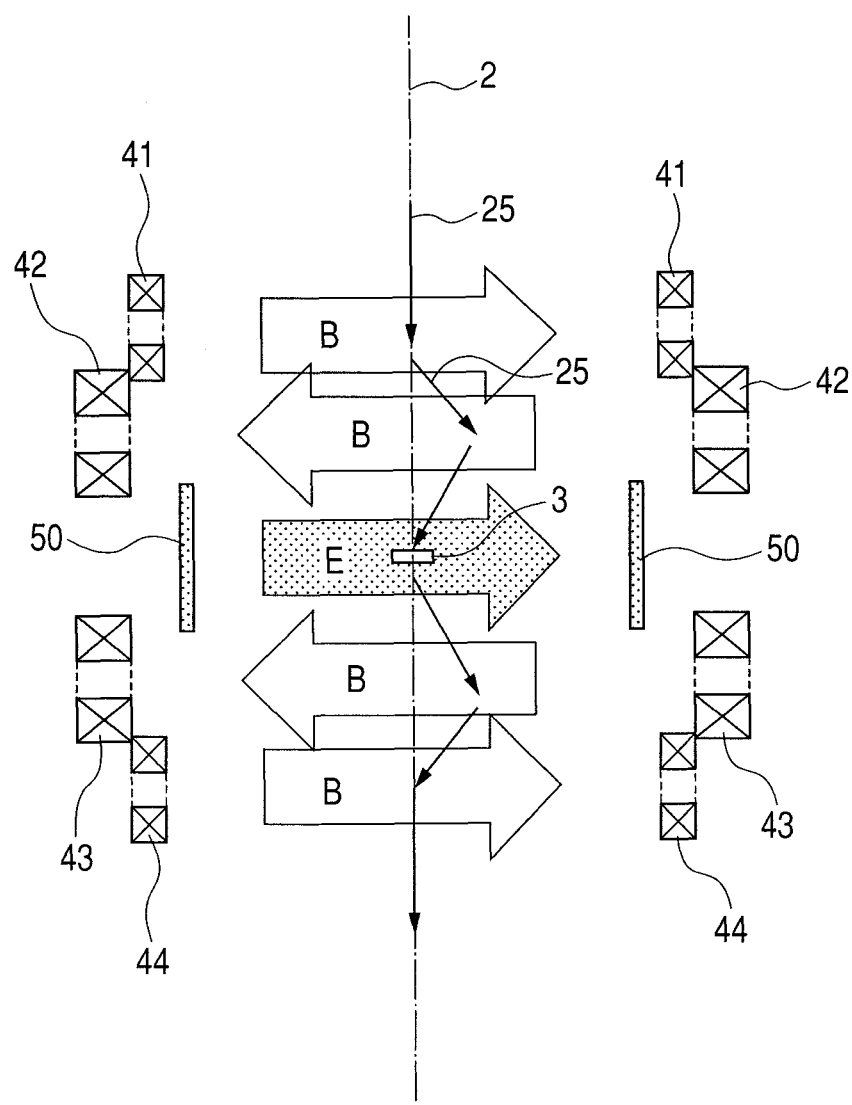
FIG. 28 is a schematic diagram illustrating the relationship between the electromagnetic field and the trajectory of a charged particle beam in a fifteenth embodiment.

A fifteenth embodiment of the present invention is schematically shown in FIG. 28. It is constructed such that, like that shown in FIG. 27 (fourteenth embodiment), the coil-pair (41 and 42) for deflection by magnetic field is arranged in two tiers above the specimen 3 and the coil-pair (43 and 44) for deflection by magnetic field is arranged in two tiers below the specimen 3. This arrangement realizes the deflection in five stages. According to this arrangement, no electric field is necessary for deflection above and below the position of the specimen and hence the parallel-plate electrode-pair 50 are miniaturized and the region of electric field to be applied is restricted in the vicinity of the position of the specimen.

As in the thirteenth and fourteenth embodiments, there is the possibility of adding the coil-pair and parallel-plate electrode-pair for application of electromagnetic field in both the directions of the X axis and Y axis or adding the coil-pair and parallel-plate electrode-pair for application of electromagnetic field in the direction of the Z axis.

The foregoing is a detailed description of the electromagnetic field application system according to the present invention. The one demonstrated in each embodiment may be mounted on an electron microscope as shown in FIGS. 3 and 15, as well as on any charged particle device such as scanning electron microscope, transmission electron microscope, and ion beam apparatus, as a matter of course.

What is claimed is:

1. An electromagnetic field application system to a specimen for observation or fabrication to be used in the charged particle beam instrument, with a specimen placed on the optical axis of the charged particle beam, the magnetic field being applied in a specific direction in a specific region containing a plane perpendicular to the optical axis and the plane holding the specimen thereon, and the electric field being applied in a specific direction in a specific region containing a plane perpendicular to the optical axis and the plane holding the specimen, and being applied to at least one part in the region in which the magnetic field is applied,
   wherein the electric field is generated by at least two set of parallel-plate electrode-pair having the same axis of electric field and composed of at least two plate-electrodes which are arranged at both sides of the specimen in the plane at which the specimen is positioned and opposite to the optical axis,
   wherein the parallel plate-electrodes are surrounded by magnetic shields in the plane holding the specimen, and are placed at least two positions a certain distance away from the optical axis.

2. The electromagnetic field application system according to claim 1, wherein the magnetic field and the electric field are applied in the directions which are parallel to the plane at which the specimen is positioned and also perpendicular to each other.

3. The electromagnetic field application system according to claim 2, which is capable of applying a magnetic field to the specimen in the direction parallel to the optical axis.

4. The electromagnetic field application system according to claim 3, wherein the magnetic field to be applied to the specimen in the direction parallel to the optical axis is generated by at least one set of coil-pair composed of at least two coils having the magnetic axis parallel to the optical axis.

5. The electromagnetic field application system according to claim 2, which is capable of applying an electric field to the specimen in the direction parallel to the optical axis.

6. The electromagnetic field application system according to claim 5, wherein the electric field to be applied to the specimen in the direction parallel to the optical axis is generated by at least one set of parallel-plate electrode-pair composed of at least two plate-electrodes having the axis of electric field parallel to the optical axis.

7. The electromagnetic field application system according to claim 1, wherein the magnetic field to be applied is generated by at least one set of coil-pair having the same magnetic axis and composed of at least two coils which are arranged at both sides of the specimen in the plane at which the specimen is positioned and opposite to the optical axis.

8. The electromagnetic field application system according to claim 1, wherein the charged particle beam passing along the optical axis keeps its direction of propagation without deflection because the magnetic field applied and the electric field applied cancel out each other their effect of deflection.

9. The electromagnetic field application system according to claim 1, wherein the charged particle beam proceeding along the optical axis has its trajectory deflected sequentially in the direction away from the optical axis at the upstream side of the specimen, in the direction toward the optical axis, in the direction back to the optical axis at the position where the specimen is placed and further in the direction away from the optical axis, in the direction toward the optical axis at the downstream side of the specimen, and in the direction of proceeding along the optical axis on the optical axis.

10. An electromagnetic field application system to a specimen for observation or fabrication to be used in the charged particle beam instrument,
   the apparatus being so constructed as to apply simultaneously an electric field in a specific direction and a magnetic field in a direction parallel to the plane at which the specimen is placed in at least one part of the region in which the electric field being applied in a specific direction in a specific region containing a plane perpendicular to the optical axis and the plane holding the specimen, and is applied, the specimen being placed on the optical axis of a charged particle beam and the region containing a plane perpendicular to the optical axis at which the specimen is positioned,
   wherein the electric field to be applied is generated by at least two set of parallel-plate electrode-pair composed of at least two plate-electrodes having the same axis of electric field which are arranged at both sides of the specimen in the plane at which the specimen is positioned and opposite to the optical axis,
   wherein the parallel plate-electrodes are surrounded by magnetic shields in the plane holding the specimen, and are placed at least two positions a certain distance away from the optical axis.

11. The electromagnetic field application system according to claim 10, wherein the magnetic field to be applied is generated by at least one set of coil-pair having the same magnetic axis and composed of at least two coils which are arranged at both sides of the specimen in the plane at which the specimen is positioned and opposite to the optical axis.

12. The electromagnetic field application system according to claim 10, which is capable of applying a magnetic field to the specimen in the direction parallel to the optical axis.

13. The electromagnetic field application system according to claim 12, wherein the magnetic field to be applied to the specimen in the direction parallel to the optical axis is generated by at least one set of coil-pair composed of at least two coils having the magnetic axis parallel to the optical axis.

14. The electromagnetic field application system according to claim 10, which is capable of applying an electric field to the specimen in the direction parallel to the optical axis.

15. The electromagnetic field application system according to claim 14, wherein the electric field to be applied to the specimen in the direction parallel to the optical axis is generated by at least one set of parallel-plate electrode-pair composed of at least two plate-electrodes having the axis of electric field parallel to the optical axis.

16. The electromagnetic field application system according to claim 10, wherein the charged particle beam proceeding along the optical axis has its trajectory deflected sequentially in the direction away from the optical axis at the upstream side of the specimen, in the direction toward the optical axis, in the direction back to the optical axis at the position where the specimen is placed and further in the direction away from the optical axis, in the direction toward the optical axis at the downstream side of the specimen, and in the direction of proceeding along the optical axis on the optical axis.

\* \* \* \* \*